(12) United States Patent
Roeder et al.

(10) Patent No.: US 6,692,569 B2
(45) Date of Patent: Feb. 17, 2004

(54) A-SITE-AND/OR B-SITE-MODIFIED PBZRTIO3 MATERIALS AND (PB, SR, CA, BA, MG) (ZR, TI,NB, TA)O₃ FILMS HAVING UTILITY IN FERROELECTRIC RANDOM ACCESS MEMORIES AND HIGH PERFORMANCE THIN FILM MICROACTUATORS

(75) Inventors: Jeffrey F. Roeder, Brookfield, CT (US); Ing-Shin Chen, New Milford, CT (US); Steven Bilodeau, Oxford, CT (US); Thomas H. Baum, New Fairfield, CT (US)

(73) Assignee: Advanced Technology Materials, Inc, Danbury, CT (US)

( * ) Notice: Subject to any disclaimer, the term of this patent is extended or adjusted under 35 U.S.C. 154(b) by 52 days.

(21) Appl. No.: 09/939,906

(22) Filed: Aug. 27, 2001

(65) Prior Publication Data

US 2002/0117647 A1 Aug. 29, 2002

Related U.S. Application Data

(62) Division of application No. 09/026,946, filed on Feb. 20, 1998, now Pat. No. 6,312,816.

(51) Int. Cl.⁷ .............................................. C30B 25/04
(52) U.S. Cl. ................. 117/104; 117/1; 117/2; 428/432; 428/469; 428/472

(58) Field of Search ................................. 428/432, 469, 428/472; 117/1, 2

(56) References Cited

U.S. PATENT DOCUMENTS

5,271,955 A * 12/1993 Manlar ........................ 427/100
5,391,393 A * 2/1995 Manlar ........................ 427/100

* cited by examiner

Primary Examiner—Felisa Hiteshew
(74) Attorney, Agent, or Firm—Margaret Chappuis; Steven J. Hultquist

(57) ABSTRACT

A modified $PbZrTiO_3$ perovskite crystal material thin film, wherein the $PbZrTiO_3$ perovskite crystal material includes crystal lattice A-sites and B-sites at least one of which is modified by the presence of a substituent selected from the group consisting of (i) A-site substituents consisting of Sr, Ca, Ba and Mg, and (ii) B-site substituents selected from the group consisting of Nb and Ta. The perovskite crystal thin film material may be formed by liquid delivery MOCVD from metalorganic precursors of the metal components of the thin film, to form PZT and PSZT, and other piezoelectric and ferroelectric thin film materials. The thin films of the invention have utility in non-volatile ferroelectric memory devices (NV-FeRAMs), and in microelectromechanical systems (MEMS) as sensor and/or actuator elements, e.g., high speed digital system actuators requiring low input power levels.

15 Claims, 11 Drawing Sheets

53/47

53/47 (4% Sr)

66/34 (10% Sr)

A-SITE-AND/OR B-SITE-MODIFIED PBZRTIO3 MATERIALS AND (PB, SR, CA, BA, MG) (ZR, TI,NB, TA)O₃ FILMS HAVING UTILITY IN FERROELECTRIC RANDOM ACCESS MEMORIES AND HIGH PERFORMANCE THIN FILM MICROACTUATORS

This is a division of U.S. application Ser. No. 09/026,946 filed Feb. 20, 1998, now U.S. Pat. No. 6,312,816.

GOVERNMENT RIGHTS IN INVENTION

The invention disclosed herein was made in the performance of United States Air Force Contract No. F33615-95-C-5428 (PSZT aspect) and NASA Contract No. NAS8-97176 (PNZT aspect). The government has certain rights in the invention.

BACKGROUND OF THE INVENTION

1. Field of the Invention

The present invention relates to the chemical vapor deposition (CVD) formation of $Pb(Zr,Ti)O_3$ materials modified with Group II cations (Sr, Ca, Ba and/or Mg) on the A-sites thereof, and Nb and/or Ta on the B-sites thereof, and to (Pb, Sr, Ca, Ba, Mg)(Zr, Ti, Nb, Ta)O₃ films having utility in ferroelectric random access memories, high performance thin film microactuators, and in related device applications.

2. Description of the Related Art

Ferroelectric materials are presently finding increased application in devices including non-volatile ferroelectric random access memories (NV-FeRAMs), uncooled infrared (IR) detectors, spatial light modulators, and microelectromechanical systems (MEMS). Many of these applications require optimized ferroelectric, pyroelectric and related properties, which are known to be sensitive to film compositions and incorporations of dopants or modifiers.

In order to effect such compositional variation, there is a need in the art for corresponding processes enabling the production of perovskite films with superior compositional and performance properties.

Directing the discussion now to a relevant background aspect of the present invention, the development of reliable actuation methods and devices is one of the key challenges in the evolution from micromachined sensors to microelectromechanical systems (MEMS). High quality piezoelectric films possess numerous properties of technological importance for such MEMS applications, including high electromechanical coupling coefficients and high piezoelectric coefficients. The most common family of material exhibiting both of these characteristics are based on $Pb(Zr_yTi_{1-y})O_3$ (PZT).

One primary factor limiting development of piezoelectric MEMS has been the lack of suitable, high quality thin film piezoelectric materials. PZT and related compositions are the best piezoelectric materials available in bulk form and are a logical choice for thin-film microactuator applications.

A number of microactuator devices can be envisioned that are based on cantilever-type deflection, including optical devices and liquid control devices. Depending upon the application, the requirements for operating deflection needed in such devices may vary widely. In a cantilevered piezoelectric microactuator of the type that may be usefully employed in positioners and microvalves, the achievable deflection for an applied voltage is directly proportional to the piezoelectric coefficient $d_{31}$. Since the deflection is directly proportional to the applied voltage and to the piezoelectric coefficient $d_{31}$, an increase in $d_{31}$ at a given voltage increases the deflection. Looking at this relationship another way, for a given deflection, the drive voltage is reduced with increased $d_{31}$. Lower drive voltage requirements are also a significant advantage as integration of PZT microactuators into integrated circuit (IC) devices is contemplated by the art and this remains important even for small displacement devices.

Accordingly, it would be a substantial advance in the art to develop compositions and process technology for the achievement of high quality films that are able to maximize deflection for a given drive voltage in microactuator applications. Similarly, these high quality films may have other advantageous properties.

Integration of thin film PZT and related materials into MEMS applications requires a well-controlled process that affords precise control of composition to maintain acceptable device performance across a wafer and from wafer-to-wafer. In addition, good step coverage is required for micromachining of the devices to protect the edges of features from unwanted etching. Finally, the process must be highly economical. This last requirement is comprised of several factors including the ability to process large area Si wafers and achieve high process throughput. Although the state of the art of bulk piezoelectric ceramic materials has changed little in the last decade, considerable effort has been focused on techniques to produce thin films of PZT and related materials.

RF sputtering ("Epitaxial Growth and Electrical Properties of Ferroelectric $Pb(Zr_{0.9}Ti_{0.1})O_3$ Films by Reactive Sputtering," T. Okamura, M. Adachi, T. Shiosaki, A. Kawabata, Jap. J. Appl. Phys 30–1 (1991): 1034), sol-gel formation ("Low Temperature Perovskite Formation of Lead Zirconate Titanate Thin Films by a Seeding Process," C. K. Wok and S. B Desu, J. Mater. Res. 8 (1993): 339), and CVD ("Preparation and Properties of $(Pb,La)(Zr,Ti)O_3$ Thin Films by Metalorganic Chemical Vapor Deposition," M. Okada and K. Tominaga, J. Appl. Phys. 71 (1992): 1955; and "Growth and Characterization of Ferroelectric $Pb(Zr,Ti)O_3$ Thin Films by MOCVD Using a 6 Inch Single Wafer CVD System," M. Shimizu, M. Fujimoto, T. Katayama, T. Shiosaki, K. Nakaya, M. Fukagawa, and E. Tanikawa, ISIF'93 Proceedings, Colorado, Springs, Colo. (1993)) have all been used to make high quality thin film PZT.

RF sputtering is an inherently low deposition rate process for complex oxide materials like PZT and uniform composition is difficult to achieve across large areas. In addition, as sputtering targets wear, composition can drift and cross-target contamination is extremely problematic for process control. Sol-gel processes offer better control of composition, but have poor step coverage. Moreover, sol-gel processing of PZT requires post-deposition annealing, which can lead to vaporization and loss of Pb, and can affect underlying IC structures. Although progress has been made in lowering processing temperatures, for example by the use of seed layers ("Low Temperature Perovskite Formation of Lead Zirconate Titanate Thin Films by a Seeding Process," C. K. Kwok and S. B. Desu, J. Mat. Res. 8 (1993): 339), these temperatures are still higher than those which have used with success to deposit PZT by MOCVD techniques of the prior art.

Therefore, a process is desired for the formation of thin films of PZT and related materials, which affords compositional control, provides uniformity of the thin film material over large areas, and achieves a high degree of conformality on the substrate structure, as well as a high deposition rate. The deposited material should also be free of pinholes, since in capacitive and many other devices, pinholes will result in a shorted, useless device.

For thin film PZT and related materials, precise and repeatable compositional control is required in order to produce films of high quality. Physical deposition methods (e.g., sputtering, evaporation) of thin film deposition are deficient in this regard, as are traditional approaches to MOCVD involving the use of bubblers.

Turning to ferroelectric PZT, it is generally recognized that many of the electrical properties can be improved by replacing A or B site species with cations of a higher oxidation state. This is typically referred to as donor doping. In specific cases improvements in leakage resistance, fatigue and imprint have been attributed to donor doping. Improved leakage resistance is observed for donor doping and is believed to be a result of compensation of native and impurity acceptor defects. Improvements in fatigue have been reported for doping with yttrium (Y), (Kim, J. H.//Paik, D. S.//Park, C. Y.//Kim, T. S.//Yoon, S. J.//Kim, H. J.//Jeong, H. J., 'Effect of Yttrium Doping on the Ferroelectric Fatigue and Switching Characteristics of $Pb(Zr_{0.65}Ti_{0.35})O_3$ Thin-Films Prepared by Sol-Gel Processing', INTEGRATED FERROELECTRICS, (10), 1995, pp. 181–188), lanthanum (La), (Shimizu, M.//Fujisawa, H.//Shiosaki, T., 'Effects of La and Nb Modification on the Electrical-Properties of $Pb(Zr,Ti)O_3$ Thin-Films by MOCVD', INTEGRATED FERROELECTRICS, 14, 1997, pp. 69–75), niobium (Nb), (Tuttle, B. A.//Alshareef, H. N.//Warren, W. L.//Raymond, M. V.//Headley, T. J.//Voigt, J. A.//Evans, J.//Ramesh, R., '$La_{0.5}Sr_{0.5}CoO_3$ Electrode Technology for $Pb(Zr,Ti)O_3$ Thin-Film Nonvolatile Memories', MICROELECTRONIC ENGINEERING, 29, 1995, pp. 223–230.), and tantalum (Ta), (Choi, G. P.//Ahn, J. H.//Lee, W. J.//Sung, T. H.//Kim, H. G., 'Phase Formations and Electrical-Properties of Doped-PZT/PbTiO3 Films Deposited by Reactive Sputtering Using Multi-Targets', MATERIALS SCIENCE AND ENGINEERING B-SOLID STATE MATERIALS FOR ADVANCED TECHNOLOGY, 41, (1), 1996, pp. 16–22.). Significantly enhanced imprint resistance was demonstrated by donor doping with Ta using a sol-gel thin film fabrication process (W. L. Warren, D. Dimos, G. Pike, B. Tuttle, and M. Raymond, "Voltage shifts and imprint in ferroelectric capacitors", Appl. Phys. Lett., 67 (6), (1995), pp. 866–868.).

Doping is straightforwardly achieved using deposition processes such as sputtering and sol-gel. To achieve doped PZT by MOCVD requires identification of suitable precursor chemicals that decompose to the desired product and do not undergo undesirable interactions during delivery and transport to the substrate. Few examples of doping by MOCVD exist in the prior art, and as will be described, many have never been described to date. The most common dopant, La, has been deposited by MOCVD to provide PLZT films as reported by Van Buskirk, P. C.//Roeder, J. F.//Bilodeau, S., 'Manufacturing of Perovskite Thin-Films Using Liquid Delivery MOCVD', INTEGRATED FERROELECTRICS, (10), 1995, pp. 9–22.). While Nb doped PZT has been demonstrated by Shimizu et al., they used tetraethyl Pb, $Zr(tertiary\ t\text{-butoxide})_4$ and $Ti(isoproxide)_4$ for Pb Zr and Ti precursors, respectively, and $Nb(ethoxide)_5$ as a Nb precursor (Shimizu, M.//Fujisawa, H.//Shiosaki, T., 'Effects of La and Nb Modification on the Electrical-Properties of Pb(Zr,Ti)O-3 Thin-Films by MOCVD', INTEGRATED FERROELECTRICS, 14, 1997, pp. 69–75). The disadvantage of this approach is that tetraethyl Pb is toxic and relatively hazardous due to its high vapor pressure at room temperature and the lack of a suitable sensor to warn of its presence. Furthermore, the Nb precursor $Nb(ethoxide)_5$ is not compatible with safer Pb precursors, such as a $Pb(tetramethylheptandionate)_2$, used in the present application. It must be emphasized again that the discovery of a compatible set of well-behaved precursors for each doping application is essential.

There is therefore a pressing need in the art for new approaches to the deposition of novel thin film materials of such type, and for next-generation piezoelectric and ferroelectric materials applications.

SUMMARY OF THE INVENTION

The present invention relates in one aspect to a method to deposit thin film piezoelectric materials by MOCVD utilizing a liquid delivery technique. This technique affords precise compositional control by virtue of mixing liquid precursor solutions and flash vaporization of same. Flash vaporization has the added benefit of preventing unwanted premature decomposition of the precursor species; this is especially important for Group II metals (e.g., Sr, Ba, Ca and Mg). In addition, tailored precursor chemistries may be employed that are compatible for each thin film material because they do not undergo ligand exchange (or ligand exchange is degenerate). This approach prevents the formation of involatile species and facilitates reproducible gas-phase transport of the reactants.

The present invention also relates to piezoelectric and ferroelectric thin film modified PZT materials, and to devices based thereon.

As used herein, the term "thin film" refers to a film having a thickness of less than 200 µm.

Devices within the broad scope of the invention include, but are not limited to, those utilizing the thin film ferroelectric modified PZT materials in piezoelectric actuating elements; in passive as well as active MEMS devices; in optical devices, including both geometric and spectral-(or interference-) based devices, such as movable microlens arrays, or movable micromirror arrays, or in spectral devices to alter a resonant cavity in an etalon structure to detune the reflectance of the device; in micropumps and microvalves based upon a cantilever geometry of the piezoelectric film; for applications such as delivering doses of medication, running hydraulic or fluid flow systems in a MEMS configuration; in ultrasonic transducers and active vibration control devices; in ultrasonic transducers for high frequency applications allowing spatial resolution for detecting small defects such as near surface flaws in aging aircraft; in microelectronics; and in biological applications, as well as in uncooled infrared radiation pyroelectric detectors; and in non-volatile ferroelectric memory devices, for applications such as data storage (FeRAMs) and replacement of EEPROMs and flash memory.

In a specific aspect, the present invention relates to a modified $Pb(Zr,Ti)O_3$ perovskite crystal material thin film, wherein the $Pb(Zr,Ti)O_3$ perovskite crystal material includes crystal lattice A-sites and B-sites at least one of which is modified by the presence of a substituent selected from the group consisting of A-site substituents consisting of Sr, Ca, Ba and Mg, and B-site substituents selected from the group consisting of Nb and Ta.

Another specific compositional aspect of the invention relates to thin film $(Pb,Sr)(Zr,Ti)O_3$ ("PSZT"), e.g., thin film piezoelectric PSZT, and thin film ferroelectric PSZT.

A further specific aspect of the invention relates to a microelectromechanical apparatus comprising a thin film piezoelectric PSZT element as a sensor and/or actuator element thereof.

Yet another aspect of the invention relates to a method of forming on a substrate a modified Pb(Zr,Ti)O$_3$ perovskite crystal material thin film, wherein the Pb(Zr,Ti)O$_3$ perovskite crystal material includes crystal lattice A-sites and B-sites at least one that is modified by the presence of a substituent selected from the group consisting of A-site substituents consisting of Sr, Ca, Ba and Mg, and B-site substituents selected from the group consisting of Nb and Ta, comprising liquid delivery MOCVD of the thin film from metalorganic precursors of the metal components of the thin film.

The metalorganic precursors may for example comprise metal (β-diketonates), such as titanium bis(isopropoxide)bis (2,2,6,6-tetramethyl-3,5-heptanedionate) as a Ti precursor; zirconium tetrakis(2,2,6,6-tetramethyl-3,5-heptanedionate) as a Zr precursor; zirconium bis(isopropoxide) bis (2,2,6,6-tetramethyl-3,5-heptanedionate) as a Zr precursor; lead bis (2,2,6,6-tetramethyl-3,5-heptanedionate) as a Pb precursor; strontium bis(2,2,6,6-tetramethyl-3,5-heptanedionate).L, where L=a Lewis base, as a Sr precursor; niobium tetrakis (isopropoxide) (2,2,6,6-tetramethyl-3,5-heptanedionate) as a Nb precursor, and tantalum tetrakis(isopropoxide) (2,2,6,6-tetramethyl-3,5-heptanedionate) as a Ta precursor.

The modified Pb(Zr,Ti)O$_3$ perovskite crystal material thin film may suitably have any appropriate stoichiometry and elemental composition. Illustrative modified PZT materials include:
(Pb,Sr)(Zr,Ti)O$_3$,
(Pb,Ca)(Zr,Ti)O$_3$,
(Pb,Ba)(Zr,Ti)O$_3$,
(Pb)(Nb,Zr,Ti)O$_3$,
(Pb)(Ta,Zr,Ti)O$_3$,
(Pb,Ca)(Ta,Zr,Ti)O$_3$,
(Pb,Sr)(Ta,Zr,Ti)O$_3$,
(Pb,Ca)(Nb,Zr,Ti)O$_3$, and
(Pb,Sr)(Nb,Zr,Ti)O$_3$.

In a specific aspect, the Pb(Zr,Ti)O$_3$ perovskite crystal material may comprise a composition of the formula $$Pb_xSr_{(1-x)}Zr_yTi_{(1-y)}O_3,$$

wherein Pb:Sr:Zr:Ti has a ratio x:(1−x):y:(1−y), where x has a value of from about 0.86 to about 0.93, and y has a value of from about 0.50 to about 0.60.

In another specific aspect, the Pb(Zr,Ti)O$_3$ perovskite crystal material may comprise a composition of the formula $$Pb_{(1-x/2)}Nb_x[Zr_yTi_{(1-y)}]_{(1-x)}O_3,$$

wherein Pb:Nb:Zr:Ti has a ratio (1−x/2):x:y(1−x):(1−y)(1−x), where x has a value of from about 0.01 to about 0.07, and y has a value of from about 0.40 to about 0.60.

In yet another specific aspect, the Pb(Zr,Ti)O$_3$ perovskite crystal material may comprise a composition of the formula $$Pb_{(1-x)}Ca_x[Zr_{(y-z/2)}Ti_{(1-y-z/2)}Ta_{(z)}]_{(1-x)}O_3,$$

wherein Pb:Ca:Zr:Ti:Ta has a ratio (1−x):x:(y−z/2)(1−x):(1−y−z/2)(1−x):z (1−x), where x has a value from about 0.01 to about 0.05, y has a value of from about 0.40 to about 0.60, and z has a value from about 0.001–0.02.

Other aspects, features and embodiments of the invention will be more fully apparent from the ensuing disclosure and appended claims.

DETAILED DESCRIPTION OF THE INVENTION AND PREFERRED EMBODIMENTS THEREOF

The present invention provides a commercially useful process for forming active piezoelectric films having utility in microelectromechanical devices and ferroelectric random access memories, as well as in other piezoelectric and ferroelectric devices and applications. The process of the present invention is scalable to large areas for Si integration, and provides new thin film materials in the $Pb(ZrTi)O_3$ (PZT) family of piezoelectrics that have the ability to significantly enhance the piezoelectric effect, and other ferroelectric properties.

Figure 1:
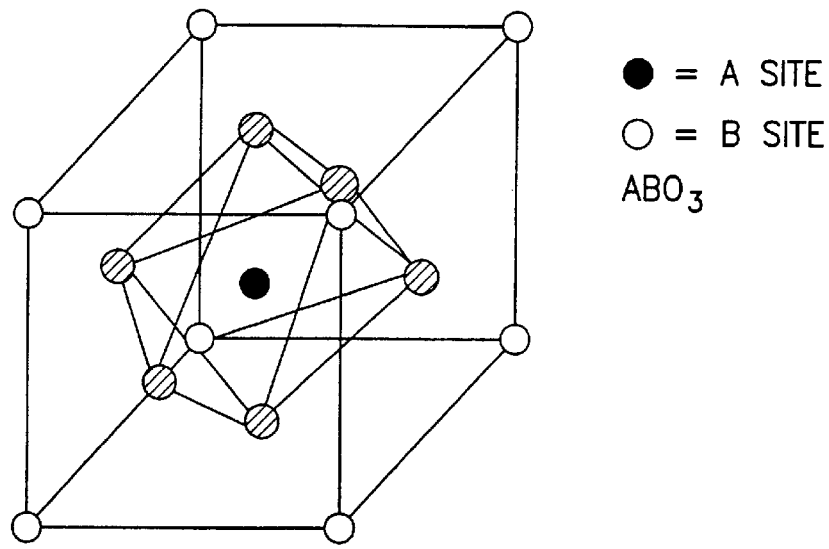
FIG. 1 is a perspective view of a crystal lattice orientation of a perovskite composition of the formula ABO$_3$ wherein the A sites are predominantly occupied by Pb and sparingly occupied by one or more species selected from the group consisting of Sr, Ba, Ca, and Mg, and/or wherein the B sites are predominantly occupied by Zr and Ti and sparingly occupied by at least one of the species selected from the group consisting of Nb and Ta. The isovalent substitutions are commonly referred to as "substitutionally modified PZT", herein described for the A-sites, while the non-isovalent substitutions are commonly referred to as "dopants", herein described for the B-sites. It is recognized that other substitutional modifications and dopants may advantageously be made for both A and B-sites.

By way of discussion of the compositional aspects of the present invention, FIG. 1 is a perspective view of a crystal lattice orientation of a perovskite composition of the formula $ABO_3$ wherein the A sites are predominantly occupied by Pb and sparingly occupied by one or more species selected from the group consisting of Sr, Ba, Ca, and Mg, and/or wherein the B sites are predominantly occupied by Zr and Ti and sparingly occupied by at least one of the species selected from the group consisting of Nb and Ta.

In the drawing, the A-sites are indicated by the atoms denoted by filled circles "●" and the B-sites are indicated by the centrally positioned atom denoted by empty circles "○." The oxygen atoms occupy the face centers.

The amount of dopant(s) or modifying substituent(s) in the crystal lattice may be varied in the broad practice of the present invention, to achieve desired orientation, structural, chemical, electrical and electromechanical properties. In general, the amounts of each of the individual modifying A-site and B-site substituents will not exceed about 20 atomic percent of the crystal lattice.

Thus, $(Pb, Sr, Ca, Ba, Mg)(Zr, Ti, Nb, Ta)O_3$ compositions of the present invention may for example incorporate Sr as one of the A-site substituents, to form ceramic compositions such as $(Pb,Sr)(Zr,Ti)O_3$ ("PSZT").

When strontium is employed as a modifying substituent in the PZT crystal lattice, it may be utilized at any suitable concentration, but is generally in the range of from about 1 to about 15 atomic % of the crystalline material. Such concentration range is analogous to that usefully employed in bulk ceramic PZT, where substituent amounts of such magnitude dramatically increase $d_{31}$ by up to 60% (see *Ferroelectric Materials and Their Applications*, Y. Xu, New York: North Holland (1991): 131 for a tabulation of dielectric constant, tan δ, kp, and $d_{31}$, as well as F. Kulcsar, J. Am. Ceram. Soc. 42 (1959): 49 and 143). Such improvements of electrical properties in microactuator applications permit microactuator drive voltages to be reduced by levels on the order of 40% of the drive voltages required by PZT per se.

The $(Pb, Sr, Ca, Ba, Mg)(Zr, Ti, Nb, Ta)O_3$ compositions of the invention may for example incorporate niobium as one of the B-site substituents, such as $Pb(Nb,Zr,Ti)O_3$ (PNZT). In these compositions, Nb dopant atoms substitute for B-site atoms (namely Zr or Ti) in the $ABO_3$ perovskite lattice and they act as donors-.

When niobium is employed as a dopant in the PZT crystal lattice, it may be utilized at any suitable concentration, but is generally in the range of from about 1 to about 10 atomic % of the crystalline material. Such concentration range is analogous to that usefully employed in bulk ceramic PZT, where substituent amounts of such magnitude dramatically increase the piezoelectric coefficient $d_{31}$ by up to 80% and the electromechanical coupling factor kp by 30%. In addition, niobium doping has been found to drastically reduce electrical leakage by more than two orders of magnitude and improve electrical breakdown strength, relative to PZT per se. In ferroelectric memory applications, niobium doping of PZT has been demonstrated to minimize imprint and coercivity while maximizing the remenance ratio (namely squareness in hysteresis loop), relative to PZT per se.

In accordance with the invention, the metalorganic precursors of the component metals of the desired $(Pb, Sr, Ca, Ba, Mg)(Zr, Ti, Nb, Ta)O_3$ film are introduced in liquid form, either as neat liquids or dilute solutions if the precursor is a liquid at ambient temperature and pressure (e.g., 25° C. and atmospheric pressure) conditions, or if the precursor composition is a solid at such ambient conditions, then as a solution of the precursor in a compatible liquid or solvent medium. The liquid or solvent medium may be of any suitable type which is compatible with the specific precursor composition employed, as is known and understood by those skilled in the art of liquid delivery MOCVD.

The liquid precursor composition then is introduced into a vaporization zone, in which the liquid is rapidly vaporized, e.g., by flash vaporization on a foraminous vaporization element heated to suitable temperature, to produce a corresponding precursor vapor.

The precursor vapor then is transported to the chemical vapor deposition chamber, which may for example comprise a CVD reactor of known or conventional type, which may be suitably equipped to introduce the precursor vapor for contact in the deposition chamber with a heated substrate at a temperature which effects deposition of the metal constituents of the vapor onto the substrate element. For this purpose, the substrate may be mounted on a heated susceptor or other substrate mounting structure, with the spent vapor from the process being discharged from the deposition chamber and subjected to further treatment or processing in a known and conventional manner.

The liquid delivery method of the present invention may be employed to form $(Pb, Sr, Ca, Ba, Mg)(Zr, Ti, Nb, Ta)O_3$ films on any compatible substrates, at any suitable thicknesses, and under any suitable process conditions in the liquid precursor vaporization and chemical vapor deposition steps. Among thin film deposition techniques, MOCVD offers a unique combination of composition control, uniformity over large areas, a high degree of conformality and a high deposition rate. Most importantly, MOCVD is capable of conformal film deposition on three-dimensional structures, a crucial feature not present from any other film formation techniques demonstrated to date. By using the liquid delivery MOCVD method it is possible to modify PZT with additional element(s) in a straightforward manner to achieve the desired product film characteristics.

The liquid delivery MOCVD method of the invention may be carried out with introduction of the precursor reagents to the vaporization zone of the process system in combination with one another, or separately. For example, multiple vaporizers may be employed to vaporize different precursors in separate vaporization operations, with the resulting vapors of the separate operations then being blended for transport to the chemical vapor deposition chamber. The precursor vapor(s) may be mixed with carrier gas(es), e.g., argon, helium, nitrogen, etc., as may be necessary or desired in a given application.

It will be appreciated that the liquid delivery MOCVD method of the invention may be carried out in any suitable manner, and the optimum process conditions may be readily determined without undue experimentation by the skilled individual in the art, to achieve the desired film on the substrate on which deposition is being conducted.

Further, the film as deposited may be further processed in any suitable manner, e.g., by annealing according to a specific time/temperature relationship, and/or in a specific atmosphere or environment, to produce the final desired thin film form (Pb, Sr, Ca, Ba, Mg)(Zr, Ti, Nb, Ta)$O_3$ material.

The thin film PSZT material of the invention has been heretofore unknown, and is a novel composition of the present invention. The present invention also embodies the first demonstration of $d_{31}$ piezoelectric effects in PZT films deposited by metalorganic chemical vapor deposition (MOCVD).

A wide variety of devices may be fabricated within the broad scope of the invention including thin film ferroelectric modified PZT materials of the invention. For example, thin film structures of the modified PZT materials of the invention may be employed in piezoelectric actuating elements, in passive as well as active MEMS devices, in optical devices, including both geometric and spectral (or interference) based devices, such as movable microlens arrays, or movable micromirror arrays. Films of such type may also find utility in spectral devices to alter a resonant cavity in an etalon structure to detune the reflectance of the device. Other potential uses of the thin film modified PZT materials of the invention include micropumps and microvalves based on cantilever geometry of the piezoelectric film, for applications such as delivering doses of medication or running hydraulic or fluid flow systems in a MEMS configuration, ultrasonic transducers and active vibration control devices, ultrasonic transducers for high frequency applications allowing spatial resolution for detecting small defects such as near surface flaws in applications such as evaluation of the structural characteristics of aging aircraft, microelectronics, biological applications, uncooled infrared radiation pyroelectric detectors, and non-volatile ferroelectric memory devices for applications such as data storage and replacement of EEPROMs and flash memory.

Figure 2:
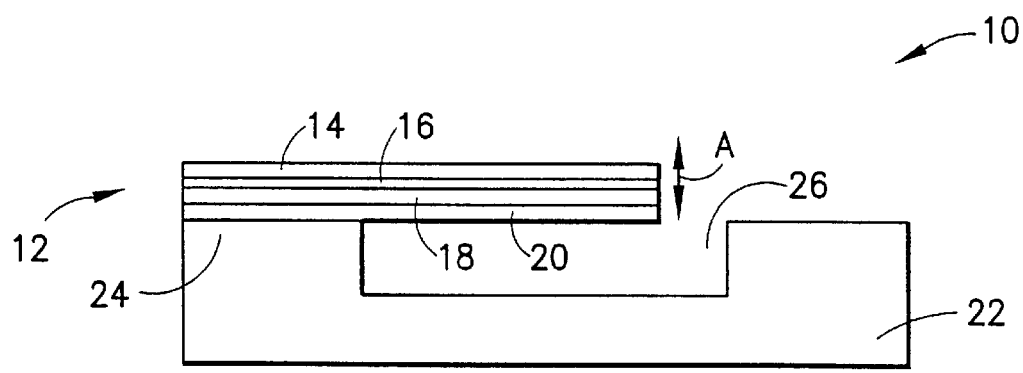
FIG. 2 is a schematic diagram of a cantilevered piezoelectric microactuator, of a type which may be used in positioners and microvalves wherein achievable deflection for an applied voltage is directly proportional to the piezoelectric coefficient $d_{31}$.

As a specific illustrative example of a device that may usefully employ the modified PZT thin film materials of the present invention, FIG. 2 is a schematic diagram of a cantilevered piezoelectric microactuator 10, of a type which may be used in positioners and microvalves wherein achievable deflection for an applied voltage is directly proportional to the piezoelectric coefficient $d_{31}$. The microactuator 10 includes a cantilever beam member 12 comprising upper electrode 14, piezoelectric thin film element 16, lower electrode 18, and support membrane 20. The cantilever beam member 12 as shown is positioned at one end on pedestal 24 of the substrate 22 with the other end being positioned over actuator cavity 26 to allow deflectional vertical movement of the cantilever beam 12 in operation of the device, in the direction indicated by bi-directional arrow A.

A number of microactuator devices can be envisioned that are based on cantilever-type deflection, including optical devices and liquid control devices. Depending on the application, the requirements for operating deflection needed in such devices may vary widely. In a cantilevered piezoelectric microactuator of the type that may be usefully employed in positioners and microvalves, the achievable deflection for an applied voltage is directly proportional to the piezoelectric coefficient $d_{31}$. Since the deflection is directly proportional to the applied voltage and to the piezoelectric coefficient $d_{31}$, an increase in $d_{31}$ at a given voltage increases the deflection. Looking at this relationship another way, for a given deflection, the drive voltage is reduced with increased $d_{31}$. Lower drive voltage requirements are also a significant advantage as integration of microactuators into integrated circuit (IC) devices is contemplated by the art and this remains important even for small displacement devices. The modified PZT thin film materials of the present invention have piezoelectric coefficient characteristics that render them highly advantageous in such microactuator applications.

The metalorganic chemical vapor deposition process of the invention permits the production of films of PSZT enabling the development of piezoelectrically controlled microelectromechanical devices. Applications for such PSZT films are widespread. Optical uses range from micromirrors to micro-etalons, which could be detuned from a reflectance condition. Device dimensions from tens to hundreds of microns are possible, and MOCVD has particular advantage in the fabrication of arrays of devices where surface topology will be present. Other optical positioners can also be based on these films, such as deformable mirrors. In other device applications utilizing the thin film modified PZT materials of the invention, microvalves and micropumps have many important applications from industrial control to gas sampling devices.

In one embodiment of the present invention, the precursors for the metal components of the product film are dissolved in a solvent and flash vaporized at temperatures between about 100 to about 300° C. thermally and carried into the MOCVD reactor with a carrier gas (e.g., Ar, $N_2$, He, or $NH_4$) where they are mixed with an oxidizing co-reactant gas (e.g., $O_2$, $N_2O$, $O_3$) and transported to the deposition chamber to undergo decomposition at a substrate heated between about 400 to about 1200° C. at chamber pressures between about 0.1 to about 760 torr. Other active oxidizing species may be used to reduce deposition temperature, as through the use of a remote plasma source.

Illustrative examples of compatible precursor chemistries are listed below, for production of corresponding (Pb, Sr, Ca, Ba, Mg)(Nb, Ta, Zr, Ti)$O_3$ films:

(Pb,Sr)(Zr,Ti)$O_3$,
(Pb,Ca)(Zr,Ti)$O_3$,
(Pb,Ba)(Zr,Ti)$O_3$,
(Pb,Mg)(Zr,Ti)$O_3$,
(Pb)(Nb,Zr,Ti)$O_3$,
(Pb)(Ta,Zr,Ti)$O_3$,
(Pb,Ca)(Ta,Zr,Ti)$O_3$,
(Pb,Sr)(Ta,Zr,Ti)$O_3$,
(Pb,Ca)(Nb,Zr,Ti)$O_3$, and
(Pb,Sr)(Nb,Zr,Ti)$O_3$,
(Pb,Mg)(Nb, Zr,Ti)$O_3$, PZT ceramics exhibit piezoelectric effects over a wide range of compositions. The highest electromechanical coupling factors occur in the region of the morphotropic phase boundary between the tetragonal ferroelectric phase and the rhombohedral ferroelectric phase. This boundary occurs at approximately 48 mol % $PbTiO_3$ in the $PbTiO_3$-$PbZrO_3$ system (see *Piezoelectric Ceramics*, B. Jaffe, W. A. R. Cook Jr., and H. Jaffe, , New York: Academic Press (1971)). Recent work with thin films has shown similar results (see "Measurement of Piezoelectric Coefficients of Ferroelectric Thin Films," K. Lefki and G. J. M. Dormans, J. Appl. Phys. 76 (1994): 1764). Useful Zr/Ti ratios near the morphotropic boundary are in the range of from about 40/60 to about 60/40.

MOCVD of oxide films is usually carried out by injecting a metalorganic precursor gas stream into a deposition chamber at reduced pressure. The precursors decompose thermally on a heated substrate and are converted to oxides by an oxidizing gas which is also fed into the chamber. The present invention preferably is carried out with an MOCVD technique permitting the use of a wide range of safe precursor chemistry without the control problems of traditional MOCVD methods, as more fully described in "MOCVD of BaSrTiO3 for DRAMs", P. S. Kirlin, Proc. of the 4th ISIF, 1994; "Liquid delivery of low vapor pressure MOCVD precursors", Gardiner, R. A., Van Buskirk, P. C., Kirlin, P. S., Proceedings Mat. Res. Soc. 1993 Fall Meeting, and U.S. Pat. No. 5,204,314, issued Apr. 20, 1993, the disclosures of which hereby are incorporated herein by reference in their entirety.

Figure 3:
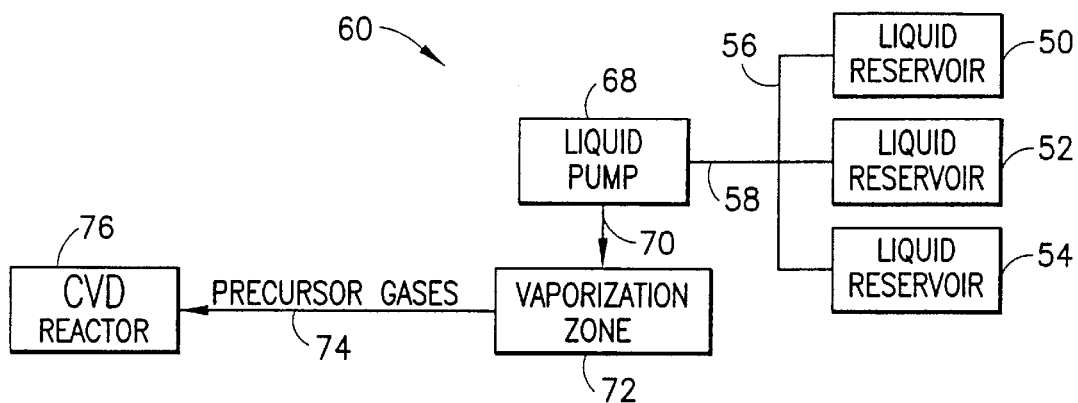
FIG. 3 is a schematic representation of a liquid delivery system for simultaneous, controlled introduction of metalorganic compounds to a CVD reactor.

In the liquid delivery MOCVD approach, liquid solutions are supplied to a vaporization zone using a high precision pump or other supply arrangement, for example as shown in FIG. 3.

FIG. 3 is a schematic representation of a liquid delivery system 60 for simultaneous, controlled introduction of metalorganic compounds to a CVD reactor. The metalorganic compounds are in respective liquid solutions in reservoirs 50, 52 and 54 which are manifolded together by manifold 56 joined in liquid flow communication with liquid precursor stream feed line 58. From feed line 58, the precursor stream is flowed under the action of pump 68 through line 70 to the vaporization zone 72.

The vaporization zone may contain a heated frit or other elevated temperature vaporization matrix, such as a screen, mesh, metal or ceramic discs, etc., on which the liquid is rapidly vaporized to form the precursor vapor stream which then is flowed in vapor feed line 74 to the CVD reactor 76 for deposition of the modified PZT film on a substrate therein (not shown).

The major advantage of this liquid delivery MOCVD approach is that liquids can be mixed just prior to vaporization; besides its simplicity, the ability to make slight composition adjustments via computer control (e.g, by metering the respective precursor liquids from the reservoirs to the pump and/or vaporization zone) makes this approach highly desirable. This technique has been applied to the controlled deposition of PbLaTiO$_3$ ("Chemical Vapor Deposition of Pb$_{1-x}$La$_x$TiO$_3$, " P. C. Van Buskirk, J. F. Roeder, S. Bilodeau, S. Pombrik, and H. Beratan, Integrated Ferroelectrics 6 (1995): 141), YBaCuO ("In-Situ Growth of C-Axis Oriented YBa$_2$Cu$_3$O$_7$ on Silicon with Composite Buffer Layers by Plasma Enhanced Metalorganic Chemical Vapor Deposition" Zhang, J.; Gardiner, R. A.; and Kirlin, P. S.; Mat. Res. Soc. Symp. Proc., Vol. 275, (1992) 419), TlBaCaCuO ("Metalorganic chemical vapor deposition of Tl$_2$Ba$_2$CaCu$_2$O$_x$ superconducting thin films using fluorinated β-diketonate source reagents." Hamaguchi, N.; Gardiner, R.; Kirlin, P. S.; and Dye, R.; Hubbard, K. M.; Muenchausen, R. E.; Appl. Phys. Lett., 57 (1990) 2136), and BaTiO$_3$ ("Reduced Pressure MOCVD of Highly Crystalline BaTiO$_3$ Thin Films", Van Buskirk, P. C.; Gardiner, R. A.; and Kirlin, P. S., Nutt, S., J. Mater. Res. 7(3) (1992) 542).

Compared to traditional MOCVD bubbler technology, liquid delivery allows deposition rates five and ten times higher, respectively, for PLZT and BaSrTiO$_3$ films ("Large area growth of PZT films by MOCVD", Shimizu, M., Fujimoto, M., Katayama, T., Shiosaki, T., Proceedings, 5$^{th}$ Int. Symp. on Integ. Ferroelectrics, Colorado Springs, Colo., Apr. 19–21, 1993; and "SrTiO$_3$ thin films by MOCVD for 1 Gbit DRAM applications, Lesaicherre, P.-Y., Proceedings, 6$^{th}$ Int. Symp. on Integ. Ferroelectrics, Monterey, Calif., Mar. 14–16, 1994). The disclosures of all of the foregoing references are incorporated herein by reference.

The solvent media used in the liquid delivery MOCVD process of the invention may suitably comprise solvent compositions as disclosed in U.S. patent application Ser. No. 08/414,504 filed Mar. 31, 1995 in the names of Robin A. Gardiner, et al., U.S. patent application Ser. No. 08/484,654 filed Jun. 7, 1995 in the names of Robin A. Gardiner, et al., and U.S. patent application Ser. No. [Docket 2771-167CIP2] filed Nov. 20, 1997 in the names of Thomas H. Baum, et al., which are compatible with the specific metalorganic precursors used for forming the (Pb, Sr, Ca, Ba)ZrTiO$_3$ thin film materials and efficacious in the constituent liquid delivery and chemical vapor deposition process steps.

Figure 4:
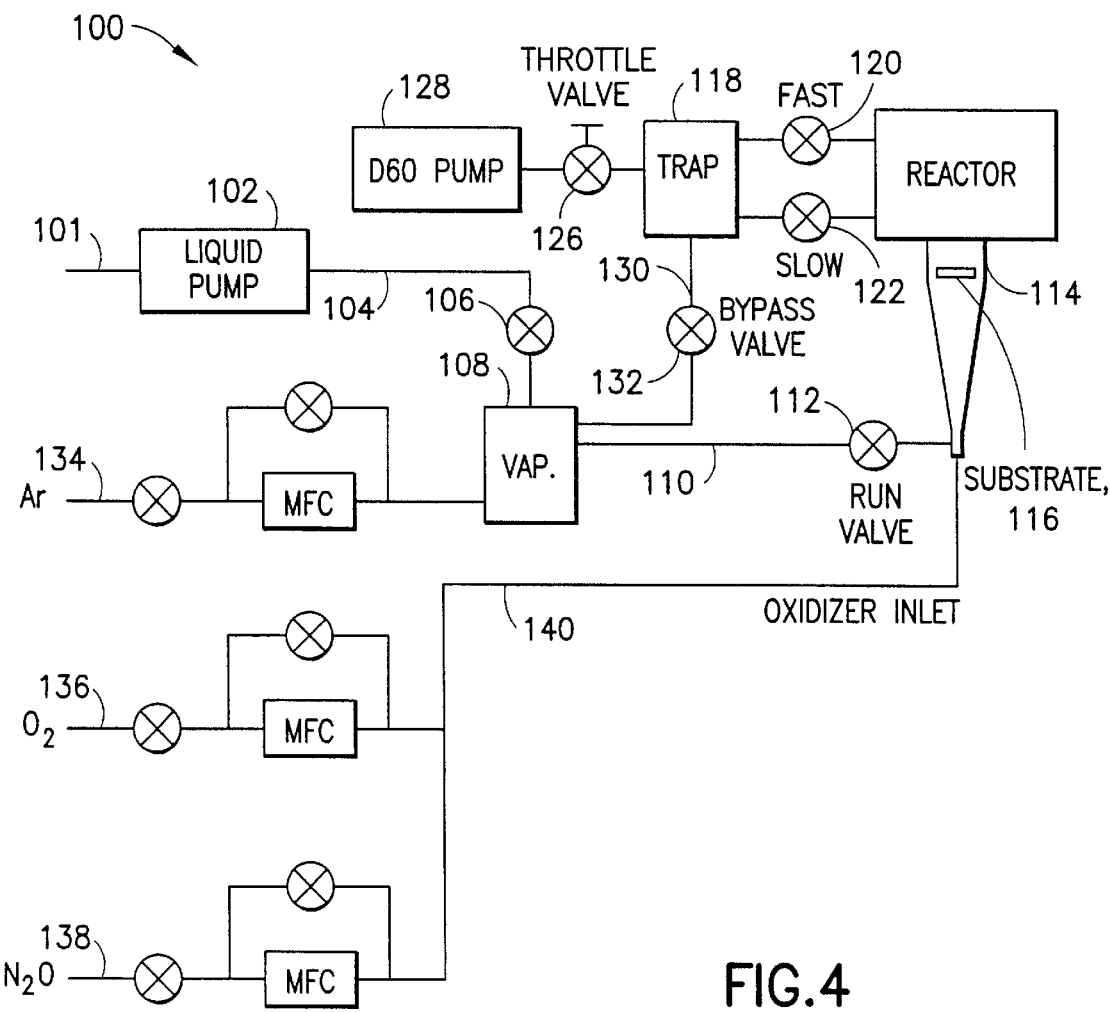
FIG. 4 is a schematic representation of a CVD reactor that may be usefully employed for PZT film growth.

FIG. 4 is a schematic representation of a portion of a liquid delivery MOCVD process system 100 that may be usefully employed for PZT film growth. The liquid stream comprising multiple precursor solutions homogeneously mixed together is introduced to the system in line 101, and passes to the liquid stream pump 102, from which it is discharged into feed line 104 containing flow control valve 106 and passes into the vaporization chamber 108.

The vaporization chamber 108 of the FIG. 4 system may be similarly constructed as described in connection with the FIG. 3 liquid delivery MOCVD system. The vaporization chamber 108 receives a flow of argon carrier gas from line 134 containing flow control valves and a bypass flow loop, as well as a mass flow controller. The resulting precursor vapor then flows in line 110 containing flow control valve 112 into the CVD reactor 114 containing heated substrate 116 on which the desired PZT thin film is deposited.

Also introduced into the CVD reactor is a flow of oxidizer gas in line 140 formed by makeup oxygen gas from line 136 and makeup N$_2$O gas from line 138, each containing suitable valving and mass flow controllers. Effluent gas from the CVD reactor 114 passes to the trap 118 through flow lines including a main (fast pump) line containing flow control valve 120 and an auxiliary (slow pump) line containing flow control valve 122. A vaporizer bypass line 130 containing flow control valve 132 therein interconnects the vaporizer with the trap.

The reactor 114 and the trap 118 are in flow communication with pump 128 by an interconnecting line containing throttle valve 126, to impose a proper pressure drop in the system and to ensure discharge of spent precursor vapor from the CVD reactor.

A suitable lead precursor for MOCVD formation of lead-containing titanates of the invention is lead bis(2,2,6, 6-tetramethyl-3,5-heptanedionate) [Pb(thd)$_2$] and Lewis base coordinated analogs. As used herein, the term thd=2, 2,6,6-tetramethyl-3,5-heptanedionate. The Pb(thd)$_2$ compound has no appreciable vapor pressure at room temperature, which makes it much safer to handle than alkyl lead reagents such as tetraethyl Pb. However, the low volatility of Pb(thd)$_2$ (0.05 torr at 180° C.) requires the use of the method of liquid precursor delivery.

Titanium bis(isopropoxide)bis(2,2,6,6-tetramethyl-3,5-heptanedionate) [Ti(OiPr)$_2$(thd)$_2$] and zirconium tetrakis(2, 2,6,6-tetramethyl-3,5-heptanedionate) [Zr(thd)$_4$] are usefully employed as Ti and Zr source reagents, respectively.

Further, other metal β-diketonate analogs may also be usefully employed in the invention. A second source for Zr is zirconium bis(isopropoxide)bis(2,2,6,6-tetramethyl-3,5-heptanedionate). These compounds are extremely soluble in organic media and no detrimental ligand exchange is possible since the titanium atom is coordinatively saturated (see "Nuclear Magnetic Resonance and Infrared Spectral Studies on Labile cis-Dialkoxy-bis(acetylacetonato) titanium(IV) Compounds." Bradley, D. C.; Holloway, C. E. J. Chem. Soc. (A), 282 (1969)).

For doping with Sr, the Lewis base adduct of Sr (thd)$_2$ may advantageously be used, where the Lewis base is tetraglyme, tetramethylethylene diamine, pentamethyl diethylenetriamine.

For doping with Ca, the Lewis base adduct of Ca(thd)$_2$ may advantageously be used, where the Lewis base is tetraglyme, tetramethylethylene diamine, pentamethyl diethylenetriamine. For doping with Ba, the Lewis base adduct of Ba (thd)$_2$ may advantageously be used, where the Lewis base is tetraglyme, tetramethylethylene diamine, pentamethyl diethylenetriamine.

For doping with Nb, niobium tetrakis(isopropoxide) (2,2,6,6-tetramethyl-3,5-heptanedionate), Nb(O-i-Pr)$_4$(thd) may be usefully employed.

For doping with Ta, tantalum tetrakis(isopropoxide) (2,2,6,6-tetramethyl-3,5-heptanedionate), Ta(O-i-Pr)$_4$(thd) may be usefully employed.

Other suitable and corresponding reagents for Ca, Ba, Mg, and Ta may be employed. Illustrative other species of metalorganic compounds and complexes are disclosed in the aforementioned U.S. patent application Ser. No. 08/414,504 filed Mar. 31, 1995 in the names of Robin A. Gardiner, et al., U.S. patent application Ser. No. 08/484,654 filed Jun. 7, 1995 in the names of Robin A. Gardiner, et al., and U.S. patent application Ser. No. [Docket 2771-167CIP2] filed Nov. 20, 1997 in the names of Thomas H. Baum, et al., the disclosures of which are hereby incorporated herein by reference in their entirety.

Concerning the technological import of the methodology and films of the invention, MEMS technology based on passive devices already exists in the commercial marketplace. For example, Si based micromachined accelerometers are used in air bag sense/deployment systems in automobiles. It is not unreasonable to state that this technology will have a pervasive impact on society. A whole class of active devices has awaited the development of high quality piezoelectric actuating films, and many more devices requiring them will be designed in the future. The manufacturable process of the invention for producing high quality piezoelectric films enables the development of these active MEMS devices.

In the area of optical devices, both geometric and spectral (or interference) based devices can be based on the high quality piezoelectric films of the invention. The geometric devices can be further subdivided into refractive approaches, such as a movable microlens array, or reflective, such as a movable micromirror array. Piezoelectric thin films of the present invention can be used to alter a resonant cavity in an etalon structure to detune the reflectance of the device. Such approach has the advantage of requiring relatively little displacement, so response times can be maximized.

Micropumps and microvalves can also be based on cantilever geometry using high quality piezoelectric films of the present invention. Micropumps can be used for delivering doses of medication or to run hydraulic systems in a MEMS configuration. Microvalves are useful in this scheme as well, or for acting as a servo on a large industrial valve controlling flow in a process.

Examples of other devices based on thin film PZT materials include ultrasonic transducers and active vibration control devices. Ultrasonic transducers can be fabricated by MOCVD for high frequency applications which allow greater spatial resolution for detecting small defects. The frequency range between 50–150 MHz is very difficult to produce by traditional bulk ceramic methods. MOCVD is a thin film-forming process with a deposition rate high enough to make these devices at the required thickness of between 13 and 40 μm thick. Such transducers can be used to evaluate near surface flaws in aircraft, in microelectronics, and in biological applications.

Other potential applications of the MOCVD process to deposit PZT and PSZT extend beyond microelectromechanical devices. In addition to piezoelectric actuation, thin film PZT can be exploited based on numerous related ferroelectric properties. For example, uncooled infrared radiation detectors based on the pyroelectric effect is a technology enabled by thin film PZT and related materials. Non-volatile memory devices based on the ferroelectric effect can be used in military applications for radiation hardened data storage and commercially as a replacement for EEPROMs and flash memory.

The deposition process of the invention facilitates integration of Si drive electronics with MEMS devices. MOCVD is usefully employed in microelectronic fabrication as a manufacturing technique for large area deposition. The present invention provides a unique MOCVD process to deposit Sr-doped PZT, which has been shown to dramatically increase piezoelectric response relative to bulk ceramics. High quality thin films of PSZT has been produced for the first time and the piezoelectric effect, the key requirement for any of the aforementioned MEMS applications, has been demonstrated.

The optimum composition of the PSZT film and use of electrode processes to minimize electrical leakage can be readily determined by the skilled artisan based on the disclosure herein. Microfabrication techniques can be used in place of macroscopic approaches for making cantilever structures of piezoelectric thin film materials in the broad practice of the present invention.

The features and advantages of the present invention are more fully shown with reference to the following illustrative and non-limiting examples.

EXAMPLE 1

Films between 2500 and 5000 Å in thickness were deposited on two inch diameter TiO$_2$/Pt/TiO$_2$/Si$_3$N$_4$/Si wafers at deposition temperatures consistent with Si device integration (550° C.). First, a baseline series of PZT films was deposited with Zr/Ti ratios between 43/57 and 53/47. Then, Sr-modified PZT films were deposited near Zr/Ti~53/47, with substitution of 4–11% of Sr for Pb. A small piece of each wafer was removed for electrical characterization; the balance was utilized for blanket top electrode deposition and piezoelectric characterization. Cantilever structures were formed by cleaving the wafers into small strips. Piezoelectric characterization was carried out by applying AC signals of varying frequency to the cantilever structures and measuring resonant vibrational modes using a laser interferometer.

Crystallinity of all films was excellent and x-ray diffraction patterns routinely showed the desired perovskite crystal structure. Dielectric constants of the samples ranged from ~250 to 800 and electrical leakage currents for films with Pt top electrodes were acceptable. The Sr modified PZT films (i.e., PSZT films) had lower capacitance compared to the unmodified PZT films, which is an advantage from the viewpoint of RC time constant contributions to response times for devices made from PSZT. All films displayed ferroelectric behavior, with well-saturated hysteresis loops. More importantly, the piezoelectric effect was observed in all of the samples. This is the first demonstration of $d_{31}$ piezoelectric effects in PZT films deposited by metalorganic chemical vapor deposition (MOCVD) and the first demonstration of thin film deposition of PSZT in the art by any method.

Three solutions, each containing Pb, Zr, and Ti in different ratios bracketing the composition range of interest were mixed to the desired solution composition for a given run. A fourth solution, containing only Sr, was added to the three-way PZT mixture to produce Sr modified PZT.

The MOCVD reactor used in the foregoing illustrative deposition was an inverted vertical configuration, of a type as shown in FIG. 4 hereof. The wafer was located face down in a stagnant flow zone which yielded good lateral uniformity. The diameter of the reactor near the wafer was 5 inches, and the reactor was configured for 2 inch wafers. The vessel was made of fused quartz and the walls of the reactor were heated by convection using hot air flowing through a second quartz tube coaxial to the reactor tube (not shown) to prevent condensation of the precursors as they traveled through the reactor to the substrate. For these illustrative depositions, the reactor conditions were as follows:

| | |
|---|---|
| Substrate temperature: | 550° C. |
| Bottom electrode: | $Si/TiO_2/Pt/TiO_2$ |
| Total reactor pressure: | 2 Torr |
| Reactor wall temperature: | >230° C. |
| Ar flow (through precursor manifold): | 100 sccm |
| $O_2$ flow | 450 sccm |
| $N_2O$ flow | 450 sccm |
| Film Thickness | 0.25–0.6 µm |

First order requirements for a good ferroelectric film are controlled composition and formation of the perovskite crystal phase. In order to assess these characteristics for the deposited films, the composition of the aforementioned films was characterized by X-ray fluorescence (XRF), and crystallinity was assessed by x-ray diffraction (XRD).

Crystallinity was assessed by X-ray diffraction (XRD) with a Rigaku DMAX/3 HFX diffractometer in the Bragg-Brentano geometry ($\Theta$-$2\Theta$). Cu K$\alpha$ radiation was used in all experiments with a crystal monochrometer between the sample and the detector. Five multiple scans were run on each sample at a scan rate of 0.1°/sec.

Capacitor structures were fabricated for electrical characterization by evaporation of 1000 Å thick Pt top electrodes through a shadow mask. Deposition of Pt was carried out at 200° C. by use of halogen lamp heating. Electrical characterization was comprised of capacitance and leakage measurements. Small signal AC capacitance was measured on a Keithley 590 CV meter as a function of applied DC bias between + and −5V. Bias was swept from both directions to observe ferroelectric switching. Zero bias capacitance values were also recorded. Electrical leakage was measured using a Hewlett-Packard 4850 Semiconductor Parameter Analyzer as a function of time for all samples at various DC bias voltages. Leakage values reported here were all obtained at 30 to 100 seconds, which generally represented the true DC conduction in the film/electrode structures (i.e, steady-state leakage values).

Ferroelectric characterization was carried out on a Radiant Technologies RT6000 ferroelectric test system. Ferroelectric hysteresis loops were measured using a saw tooth AC signal with maximum voltages between 12–17 V.

In connection with the above-discussed characterization effort, a series of eight calibration runs was performed in order to establish the relationship of precursor solution composition to film composition. After this relationship was established, a number of PZT films were deposited in the target composition range between 40/60 and 60/40 Zr/Ti ratios. The use of the liquid delivery technique provided the precise control of composition required to form films of PZT within a relatively narrow composition range.

Figure 5:
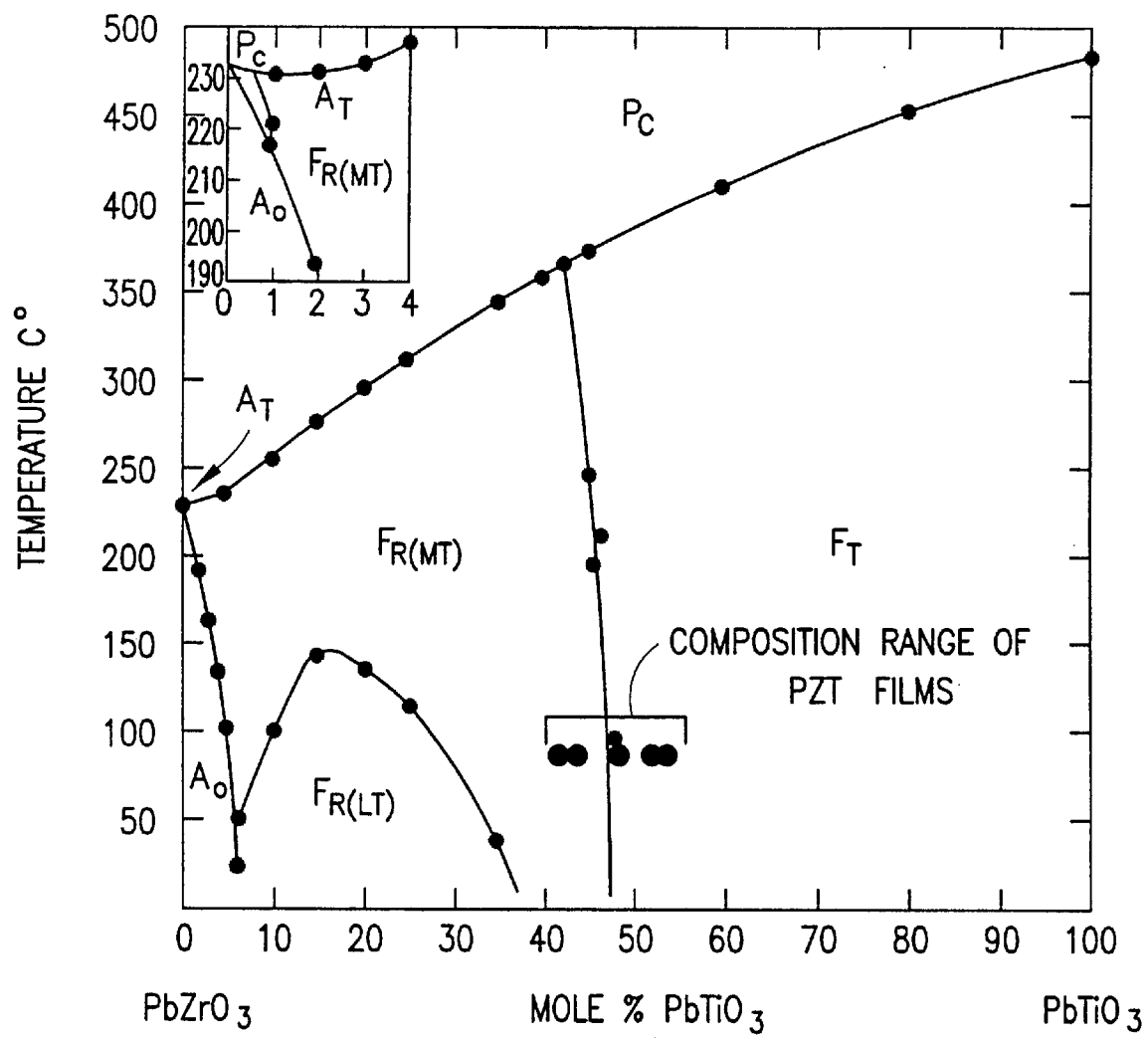
FIG. 5 shows the composition of unmodified PZT films deposited in accordance with the method of the invention, in the region near the morphotropic phase boundary between rhombohedral and tetragonal PZT.

FIG. 5 shows the composition of PZT films deposited by the liquid delivery method, in the region near the morphotropic phase boundary between rhombohedral and tetragonal PZT.

Once this series of PZT films was complete, attention was focused on the Sr modification. PSZT films were deposited by substituting $Sr(thd)_2$•tetraglyme for a portion of $Pb(thd)_2$ in the precursor solution. By using deposition conditions similar to those for PZT, films were produced of the desired stoichiometry and the perovskite crystal phase. Sr shifts the room temperature morphotropic boundary toward the $PbZrO_3$ side of the quaternary system, so film compositions with higher Zr/Ti than 52/48 were targeted.

Figure 6:
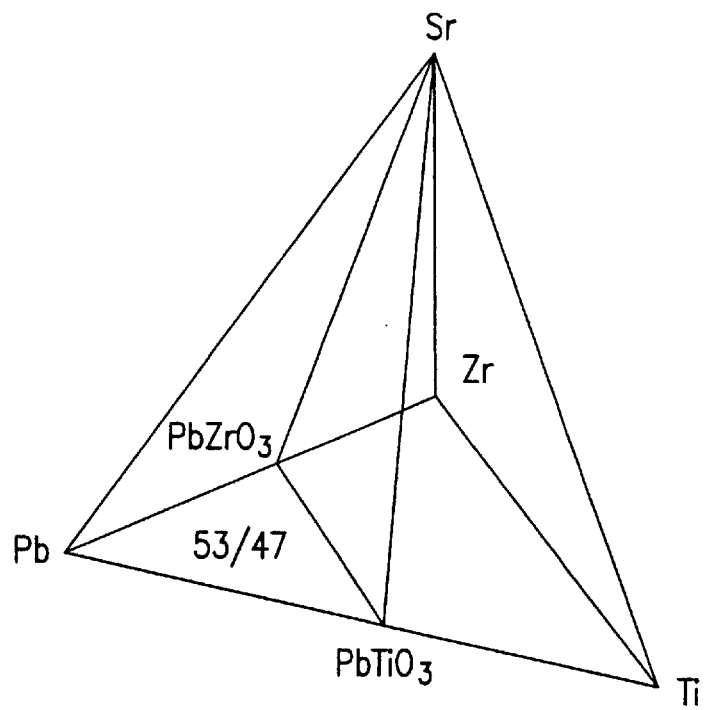
FIG. 6 shows the compositions of PSZT films deposited in accordance with the method of the invention, with compositions at the room temperature morphotropic boundary being indicated. The phase boundary shifts toward the PbZrO3 side of the system as Sr increases.

FIG. 6 shows the compositions of PSZT films deposited in accordance with the method of the invention, with compositions at the room temperature morphotropic boundary being indicated. The phase boundary shifts toward the $PbZrO_3$ side of the system with increased Sr as indicated in the figure.

The thickness and compositions of the resulting films are summarized in Table I.

TABLE I

Compositions of films given in terms of the stoichiometric formula
$Pb_{x/100} Sr_{(100-x)/100} (Zr_{y/100} Ti_{(100-y)/100})O_3$.

| Run No. | Thickness (Å) | Composition (Pb + Sr = 100, Zr + Ti = 100) | | | |
|---|---|---|---|---|---|
| | | Pb | Sr | Ti | Zr |
| 9 | 2623 | 100 | 0 | 50 | 50 |
| 12 | 4643 | 100 | 0 | 44 | 56 |
| 13 | 5193 | 100 | 0 | 54 | 46 |
| 14 | 4650 | 100 | 0 | 43 | 57 |
| 16 | 4622 | 100 | 0 | 43 | 57 |
| 17 | 4749 | 100 | 0 | 53 | 47 |
| 18 | 4073 | 96 | 4 | 51 | 49 |
| 20 | 4477 | 90 | 10 | 55 | 45 |
| 21 | 5560 | 89 | 11 | 66 | 34 |

XRD revealed excellent crystallinity for all of the PZT and PSZT films listed in Table I. A representative series of X-ray diffraction patterns for PZT films in the composition range varying from Zr/Ti=44/56 to 54/46 is shown in FIG. 7. All films showed similar mixed [100]+[111] preferred orientation.

All films therefore had preferred orientations, in contrast to random polycrystalline material, in which [110] yields the strongest diffracted intensity. The [100] component of preferred orientation is likely due to stresses induced by mismatch in coefficient of thermal expansion between the substrate (Si ~3 ppm/° C.) and the PZT (~6–10 ppm/° C.) which resulted in a tensile film stress. The minimum energy configuration causes the long axis [001] of the tetragonal cell to lie in the plane of the film. The [111] preferred orientation is likely due to the $TiO_2$ layer at the surface of the substrate that was used in this case as part of the electrode stack. Ti-rich $PbTiO_3$ seed layers have [111] preferred orientation (see, for example, "Effects of the Utilization of a Buffer Layer on the Growth of $Pb(Zr,Ti)O_3$ Thin Films by Metalorganic Chemical Vapor Deposition," M. Shimizu, M. Sugiyama, H. Fujisawa, T. Hamano, T. Shiosaki, and K. Matshushige, J. Cryst. Growth 145 (1994): 226).

Figure 8A:
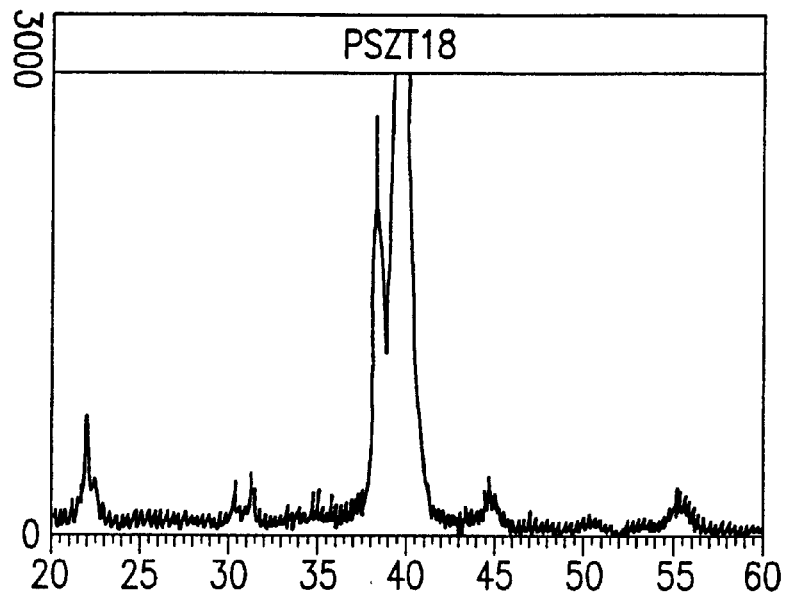
FIG. 8 shows XRD patterns of PSZT films deposited by MOCVD in accordance with the method of the invention.
Figure 8B:
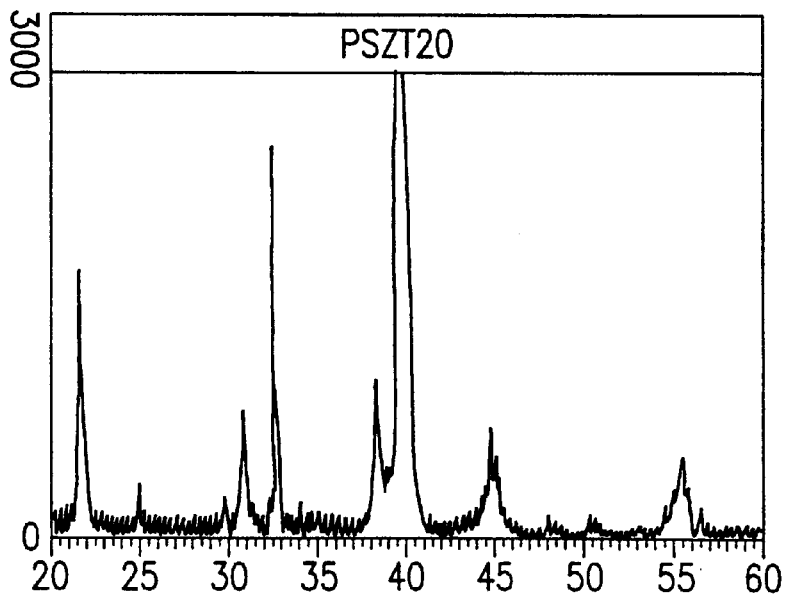

FIG. 8 shows XRD patterns of the PSZT films deposited by MOCVD in accordance with the method of the invention, with preferred orientation similar to PZT being observed in all films. The small peak at $2\theta=30.5°$ is due to an unidentified second phase. The presence of the second phase did not cause any serious degradation of film properties, and can be eliminated by further optimization of the composition.

Figure 9:
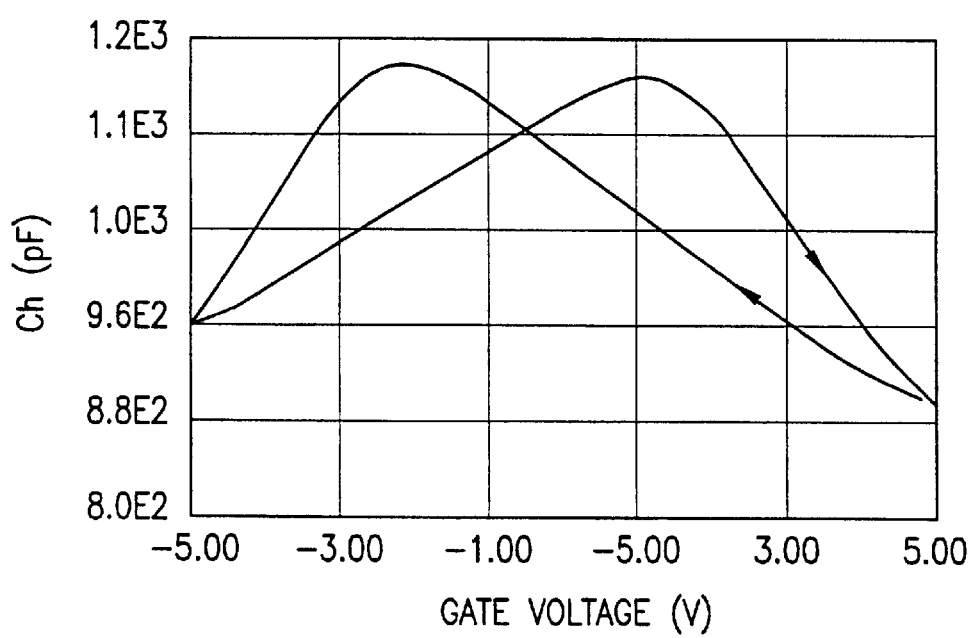
FIG. 9 shows small signal AC capacitance as a function of applied DC bias for a PZT film deposited by MOCVD, wherein electrode area was 8×10$^{-4}$ cm$^2$, and film thickness was 5193 Å, and wherein the shift in the maxima with direction of bias sweep is characteristic of a ferroelectric film.
Figure 7A:
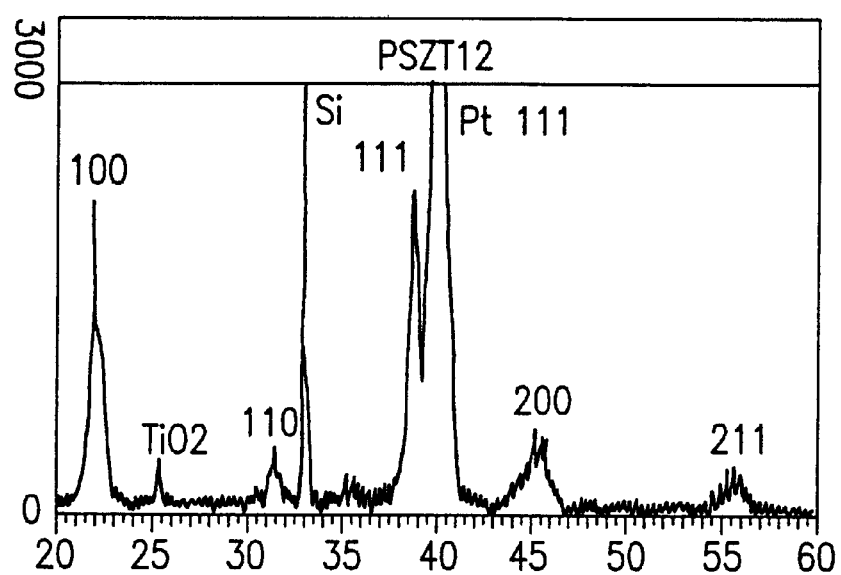
FIG. 7 shows representative X-ray diffraction patterns for Sr-modified PZT films in the composition range from Zr/Ti= 44/56 to 54/46, wherein all films show similar mixed [100]+ [111] preferred orientation.
Figure 7B:
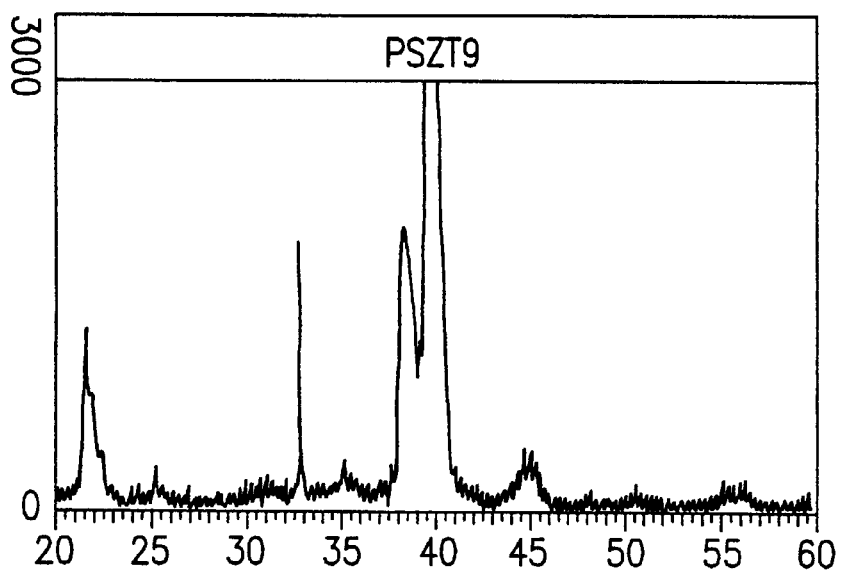
Figure 7C:
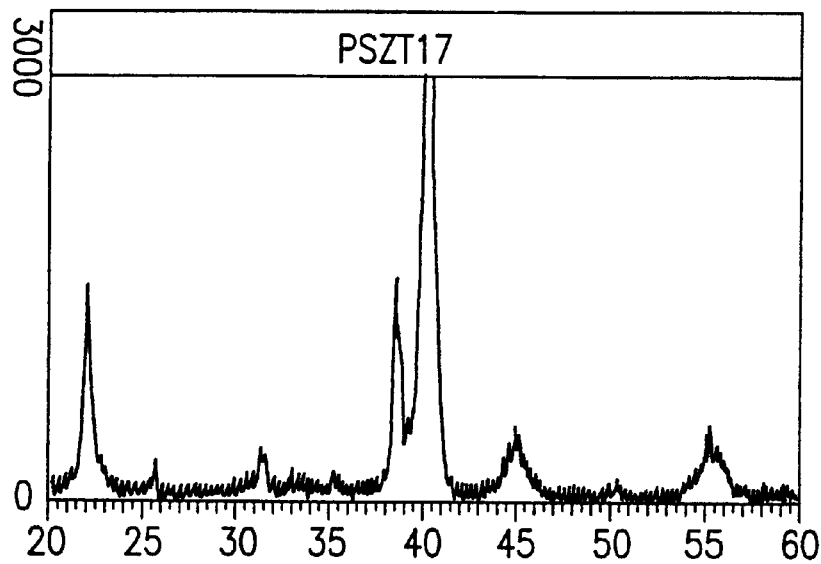
Figure 7D:
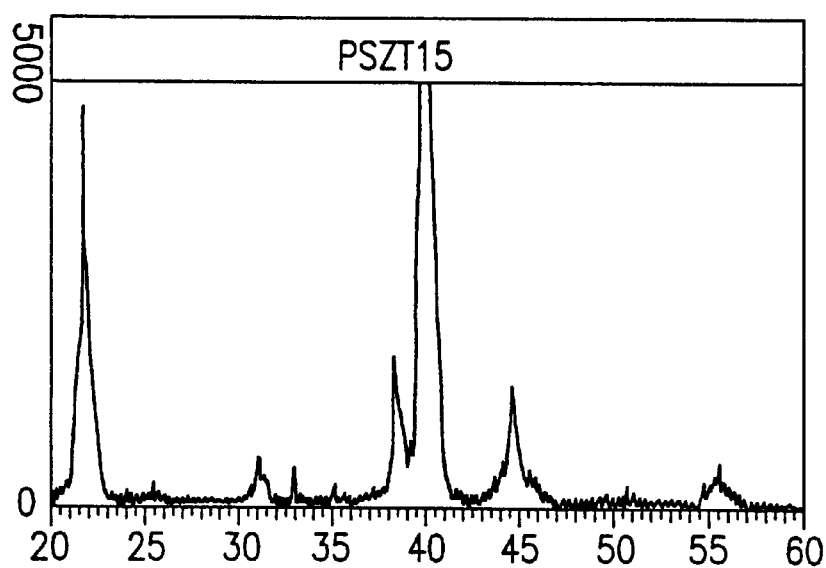

Small signal AC capacitance measurements revealed ferroelectric switching in the films when the direction of DC bias sweep was changed. FIG. 9 shows small AC signal capacitance as a function of applied DC bias for a PZT film deposited by MOCVD, wherein electrode area was $8\times10^{-4}$ $cm^2$, and film thickness was 5193 Å. The shift in the maxima with direction of bias sweep is characteristic of a ferroelectric film.

The peak in the capacitance curve corresponds to the maximum slope of the polarization-voltage hysteresis curve, which generally coincides with the coercive voltage required to switch the ferroelectric domains in the thin film (i.e., the voltages at which the hysteresis curve crosses the abscissa).

Dielectric constants for the PSZT films were found to be lower than those for the PZT films. This was in contrast to bulk data, but the effect related to the preferred orientation of the films. For bulk materials, $\epsilon_{33}$ is increased with Sr substitution (in the notation $\epsilon_{xy}$, $\epsilon$ refers to permittivity, x refers to the direction of measurement, y refers to the crystallographic direction); however the thin film material is strongly textured away from this orientation. The reduced dielectric constant for PSZT is an advantage with respect to the RC time constant of the film. This time constant contributes to the overall switching speed of a device, which is highly important in applications such as hardened optical systems.

Figure 10:
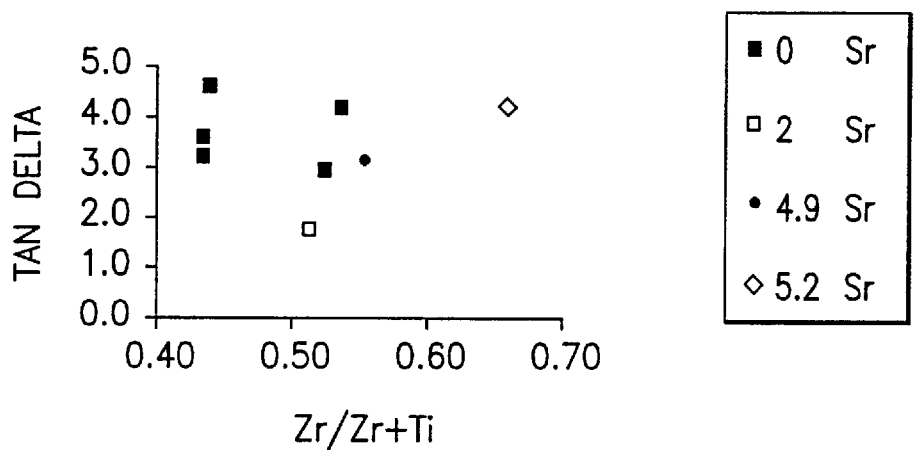
FIG. 10 shows the loss tangent as a function of composition for films deposited by MOCVD in accordance with the method of the invention.

Loss tangent was also examined as a function of composition. FIG. 10 shows loss tangent as a function of composition for films deposited by MOCVD in accordance with the method of the invention, wherein PSZT films showed lower losses with the exception of the film at Zr/Zr+Ti=0.67 where high losses were expected based on the high Zr content.

Loss tangent is known to increase at high levels of Zr, which accounts for the high value in the 5.2 atomic % Sr film. Loss tangent is generally related to the amount of energy expended in moving domain walls during ferroelectric switching; low loss is generally desirable. These results indicate that Sr improved losses in PZT films.

Figure 11A:
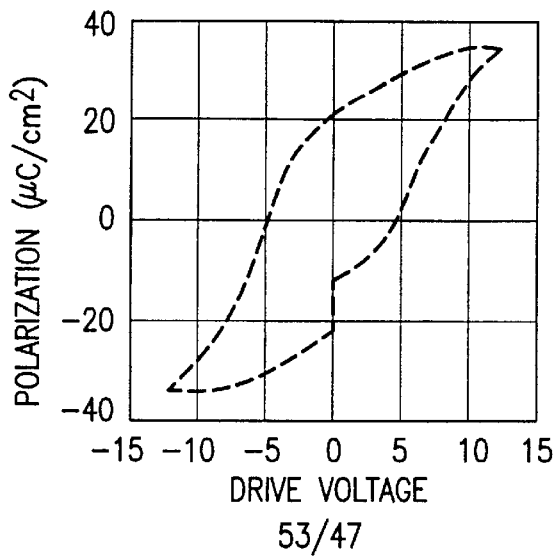
FIG. 11a shows ferroelectric hysteresis loops for representative films deposited by MOCVD in accordance with the method of the invention, wherein Zr/Ti ratios are indicated along with Sr content, demonstrating the ferroelectric effect in both PZT and PSZT.
Figure 11B:
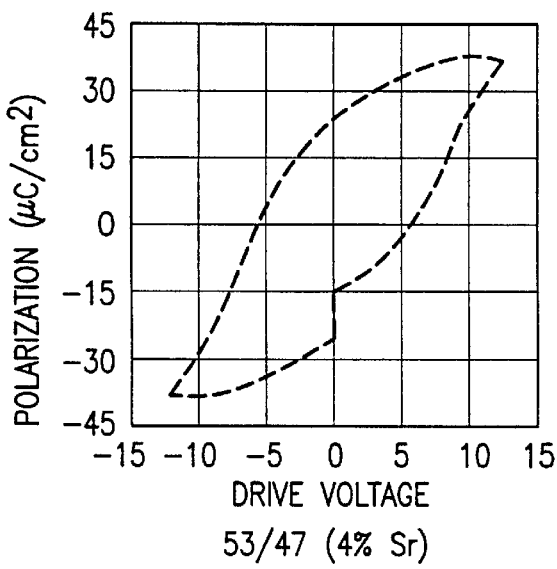
FIG. 11b shows ferroelectric hysteresis loops for representative films deposited by MOCVD in accordance with the method of the invention, wherein Zr/Ti ratios are indicated along with nominal Ca and Ta content, demonstrating the ferroelectric effect in PCTZT.
Figure 11C:
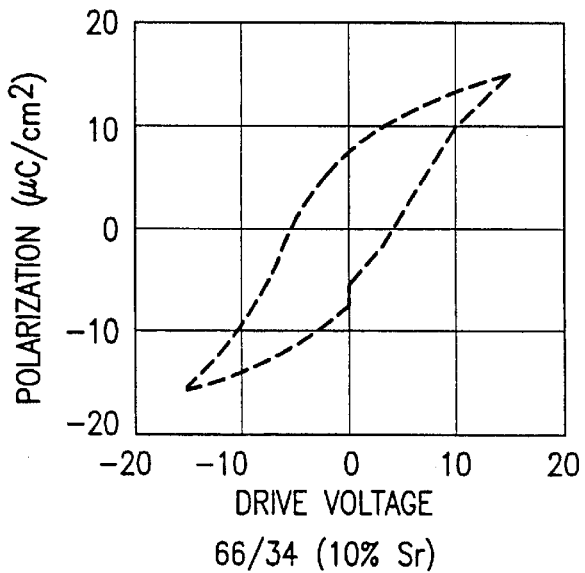

All of the deposited films displayed saturated ferroelectric hysteresis loops. FIG. 11a shows ferroelectric hysteresis loops for representative films deposited by MOCVD in accordance with the method of the invention, wherein Zr/Ti ratios are indicated along with Sr content. All loops were well saturated, demonstrating the ferroelectric effect in both PZT and PSZT.

The shape of the hysteresis loop changed with composition, a result that is observed for many ferroelectric materials. The demonstration of ferroelectric behavior in all films showed that the intrinsic quality of the PZT and PSZT thin films was high.

Eight wafers were used in deflection measurements: samples 9, 13, 14, 16, 17, 18, 20, and 21 and the wafers were processed in several batches. Upper electrodes on wafers 9, 13 and 14 were sputtered Cr/Ni while the remaining wafers had evaporated Ti/Pt upper electrodes (with Ti in contact with the PZT, used as a precaution for obtaining good adhesion).

In order to avoid the effects attributable to leakage currents caused by the Ti in the top electrodes, deflections induced by an AC signal were measured using a laser vibrometer as an alternative to DC deflection measurements, since leakage had less of an effect in dynamic measurements. One end of each beam of material was glued to a base and the laser spot was directed onto the free end of the beam. The amplitude of the AC excitation voltage was 2.82 V on all samples. The excitation voltage was swept through a range of frequencies to identify the resonances; narrower scans were done around particular peaks.

Resonances were observed on all samples, corresponding to the resonant mechanical modes of the silicon cantilever beam, demonstrating that the films were indeed piezoelectric. The PZT film was thin with respect to the silicon beam, so the film thickness had a minimal effect on the resonant frequencies. It was noted that no vibrations would have been measurable if the films were not piezoelectric. In most cases a whistle was audible as the sample was swept through the resonant frequency.

Figure 12:
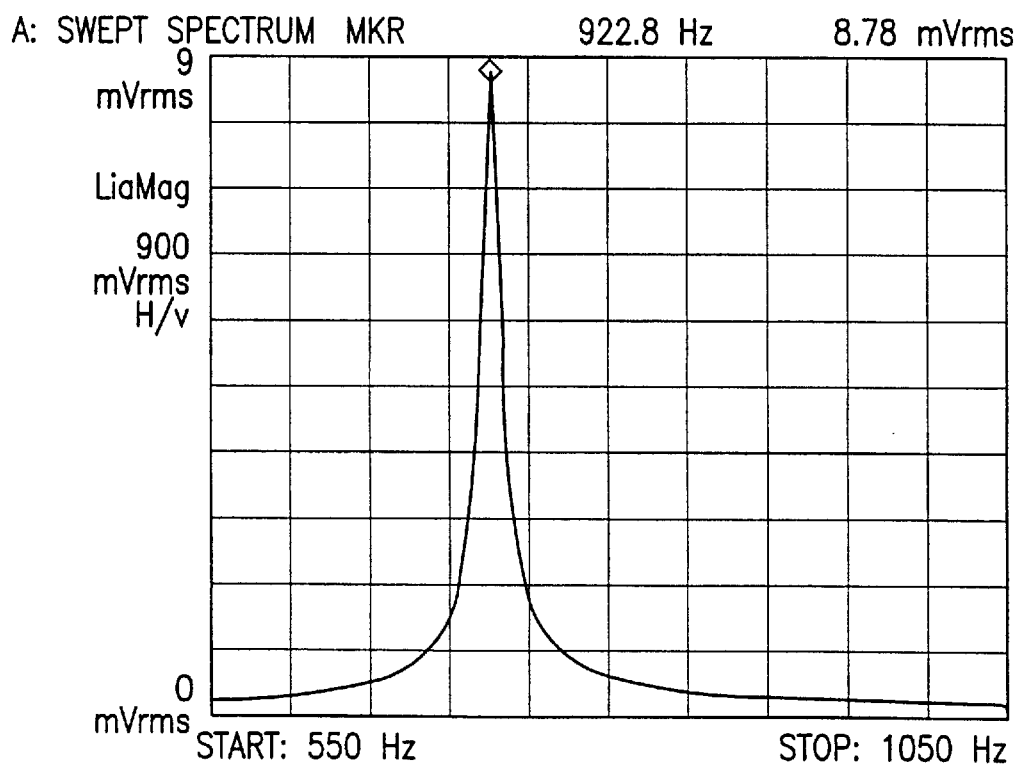
FIG. 12 shows a fundamental resonance vibrational mode of a cantilever beam, wherein the horizontal axis corresponds to excitation frequency for a sinusoidal AC wave of ±2.8 V, and the vertical axis is proportional to the amplitude of the vibration, demonstrating the piezoelectric effect in films produced by the method of the present invention.

FIG. 12 shows a fundamental resonance vibrational mode of a cantilever beam from sample 13, wherein the horizontal axis corresponded to excitation frequency for a sinusoidal AC wave of ±2.8 V, and the vertical axis was proportional to the amplitude of the vibration, clearly demonstrating the piezoelectric effect in films produced in accordance with the method of the present invention.

It was expected that the lowest measurable frequency was the fundamental bending mode. This was verified on wafer PSZT-21 by scanning the laser spot along the beam from the free end toward the clamped end. The amplitude varied quadratically as a function of position, verifying that this was the fundamental mode. Table 2 lists the fundamental frequencies and vibration amplitudes measured at resonance at the end of each beam.

TABLE 3

Resonance data determined by laser vibrometer measurements with 2.82 V excitation voltage amplitude.

| Wafer no. | Beam no. | Thickness (mm) | Freq (Hz) | Ampl (Å) |
|---|---|---|---|---|
| 9 | 1 | 380 | 1240 | 0.20 |
| 9 | 2 | 380 | 943 | 1.6 |
| 9 | 3 | 380 | 6930 | 1.2 |
| 13 | 2 | 130 | 922 | 6.2 |
| 14 | 3 | 60 | 784 | 3.1 |
| 14 | 4 | 380 | 982 | 0.02 |
| 16 | 1 | 380 | 3675 | 2.7 |
| 16 | 2 | 380 | 1195 | 0.33 |
| 16 | 3 | 380 | 4998 | 0.76 |
| 17 | 2 | 85 | 424 | 1.1 |
| 17 | 3 | 85 | 524 | 1.2 |
| 18 | 1 | 380 | 2454 | 0.16 |
| 18 | 2 | 380 | 2503 | 0.13 |
| 20 | 1 | 380 | 1167 | 0.13 |
| 21 | 2 | 380 | 1098 | 0.38 |
| 21 | 3 | 380 | 1189 | 0.37 |

All of the illustrative films described above clearly demonstrated piezoelectric effects. The liquid delivery MOCVD approach of the invention demonstrated the enhancements of $d_{31}$ piezoelectric coefficient observed by Sr substitution in bulk ceramic materials.

EXAMPLE 2

The lead precursor chosen was lead bis(2,2,6,6-tetramethyl-3,5-heptanedionate) [Pb(thd)$_2$]. This compound has no appreciable vapor pressure at room temperature, which makes it much safer to handle than tetra-alkyl lead reagents. However, the low volatility of Pb(thd)$_2$ (0.05 Torr at 180° C.) requires the use of liquid precursor delivery. Titanium bis(isopropoxide)bis(2,2,6,6-tetramethyl-3,5-heptanedionate) [Ti(O-i-Pr)2(thd)$_2$] was used as the titanium precursor. Zirconium tetrakis(2,2,6,6-tetramethyl-3,5-heptanedionate) [Zr(thd)$_4$] was used as the Zr source reagent. These compounds are extremely soluble in organic media and no possible detrimental ligand exchange is possible since the titanium atom is coordinatively saturated.

Nb doping in PZT films by MOCVD requires a niobium precursor that is thermally stable, easily transported into the gas phase, and chemically compatible with the PZT precursors in solution and during thermal vaporization. Although ligand exchange reactions often occur in solution, exchange mechanisms must be degenerate and thus not detrimental. To this end we explored the use of niobium tetrakis (isopropoxide) (2,2,6,6-tetramethyl-3,5-heptanedionate) [Nb(O-i-Pr)$_4$(thd)]. This reagent provided chemical compatibility in solution and during gas-phase transport of the entire chemical mixture.

The following process conditions were applied:

| | |
|---|---|
| Substrate temperature | 550~610° C. |
| Bottom electrode | Pt/<barrier>/Si |
| Total reactor pressure | 2~10 Torr |
| Reactor wall temperature | ~200° C. |
| Carrier Ar flow | ~100 sccm |
| O$_2$ flow | 450 sccm |
| N$_2$O flow | 0~450 sccm |
| Total reagent Molar concentration | 0.29 M |
| Reagent solution flow rate | 0.1~0.2 ml/min |

In a representative run, the film was deposited at 610° C. on Pt/MgO/Si. The pressure was 5 Torr, oxidizer flow was a mixture of 450 sccm O$_2$ and 450 sccm N$_2$O, and the reagent flow rate was 0.2 ml/min for 40 minutes. XRF analysis gave the following thickness and composition data:

| Thickness (μm) | Pb (at. %) | Nb (at. %) | Zr (at. %) | Ti (at. %) |
|---|---|---|---|---|
| 0.34 | 49.7 | 0.4 | 28.0 | 21.9 |

The film has 0.4 at % Nb with a Zr/Ti ratio of 56/44. XRD patterns taken from this film showed all characteristics associated with single-phase perovskite PNZT thin film or substrate layers (Pt or Si). These results confirmed the growth of high quality PNZT thin films by the above-described process conditions.

EXAMPLE 3

Thin film (Pb$_x$Ca$_{1-x}$) (Zr$_y$ Ti$_{1-y-z}$ Ta$_z$) was deposited by liquid source MOCVD using the precursors shown below.
Lead bis(2,2,6,6-tetramethyl-3,5-heptanedionate), [Pb(thd)$_2$]
Calcium bis(2,2,6,6-tetramethyl-3,5-heptanedionate) .tetraglyme, [Ca(thd)$_2$-tetraglyme]
Zirconium tetrakis(2,2,6,6-tetramethyl-3,5-heptanedionate), [Zr(thd)$_4$]
Titanium bis(isopropoxide)bis(2,2,6,6-tetramethyl-3,5-heptanedionate), [Ti(O-i-Pr)2(thd)$_2$]
Tantalum tetrakis(isopropoxide) (2,2,6,6-tetramethyl-3,5-heptanedionate), [Ta(O-i-Pr)$_4$(thd)]

These precursors are extremely soluble in organic media and exhibit no detrimental ligand exchange. The solvent can be that described in ATMI 167, ATMI 167-CIP, ATMI 167-CIP2 patent applications.

The following MOCVD process conditions were used:
Substrate temperature: ~565° C.
Bottom electrode: Ir/SiO$_2$/Si
Total reactor pressure: 1.2 Torr
Reactor wall temperature: ~220° C.
Carrier Ar flow: 200 sccm
O2 flow: 500 sccm
N2O flow: 500 sccm
Total reagent concentration: 0.30 M
Reagent flow rate: 0.14 ml/min.
Deposition time: 1950 seconds Solution compositions were chosen such that nominally 1% of the A sites are occupied by Ca and nominally 0.2% of the B sites are occupied by Ta.

XRD patterns taken from these films showed all characteristics associated with single-phase perovskite Ca and or Ta doped PZT thin films or substrate layers (Ir or Si). These results confirmed the growth of high quality doped PZT.

Capacitor structures were fabricated for electrical characterization by evaporation of 1000 Å thick Pt top electrodes through a shadow mask. Deposition of Pt was carried out at 200° C. by use of halogen lamp heating.

Ferroelectric characterization was carried out on a Radiant Technologies RT6000 ferroelectric test system. Ferroelectric hysteresis loops were measured using a saw tooth AC signal with maximum voltages between 2.5V. Measurement of leakage current was carried out using a Kiethley 6517 electrometer using a staircase voltage ramp with 0.5V steps and 5s dwell time at each voltage. Current density measured in this way has both relaxation and steady state leakage contributions.

Figure 13A:
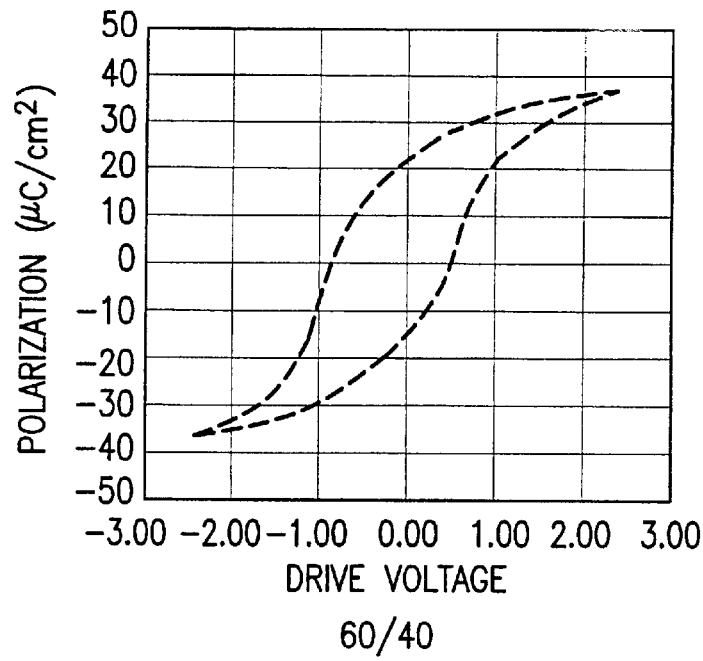
FIG. 13 shows ferroelectric hysteresis loops for films deposited by MOCVD in accordance with the method of the invention, with a Zr/Ti ratio of 40/60 both with and without 1% Ca and 0.2% Ta substitution. Both films show full saturation below 2.5V and high remanent polarization.
Figure 13B:
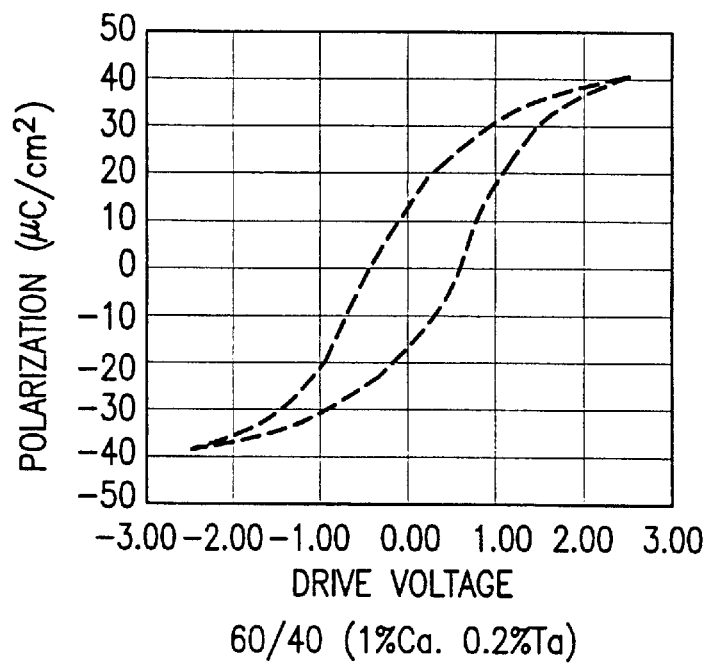
Figure 14:
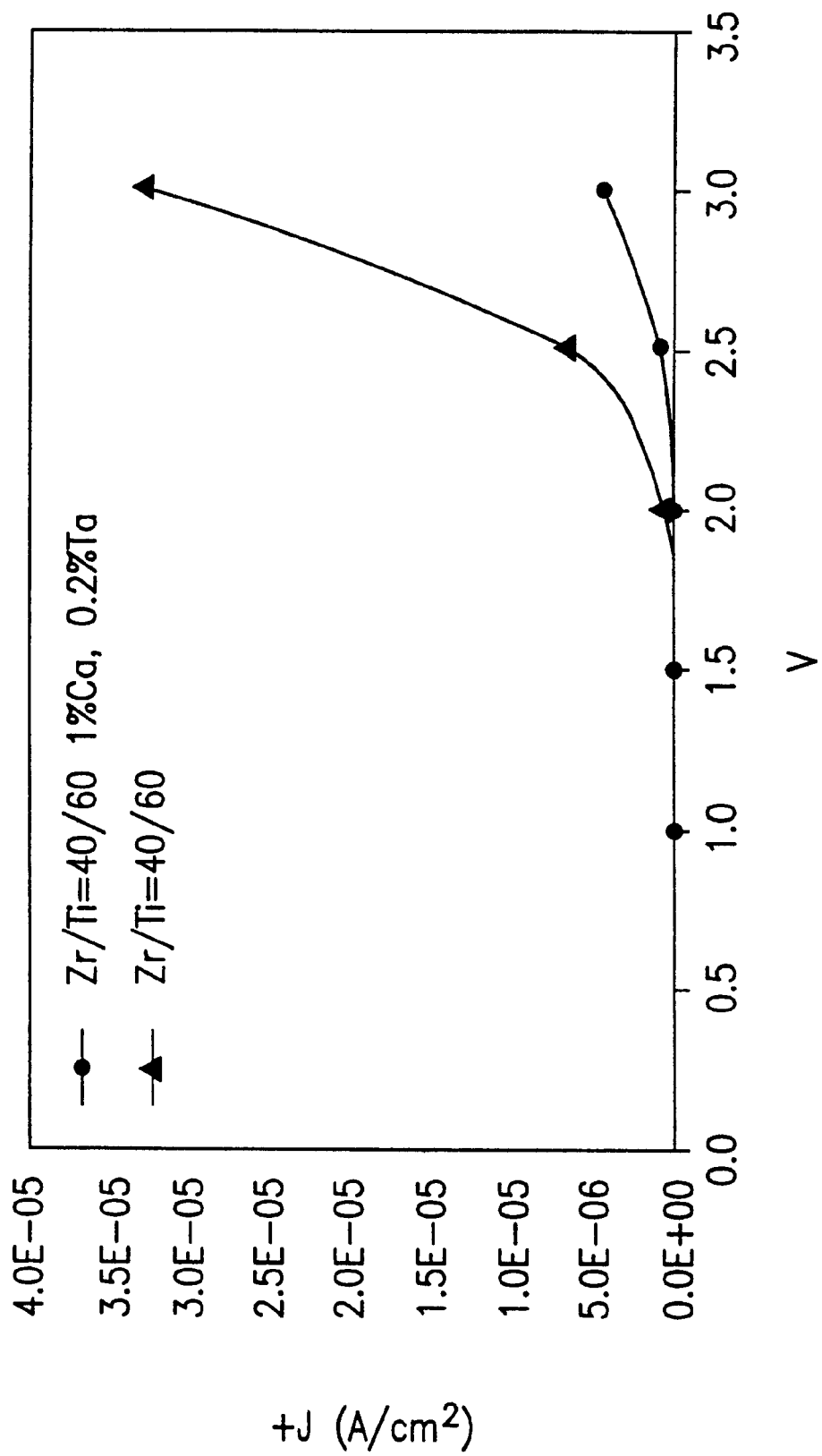
FIG. 14 shows the leakage current versus voltage for PZT with Zr/Ti of 40/60 and the same Zr/Ti with 1% Ca and 0.2% Ta substitution. The substituted material has ⅕th the leakage current density at 3V compared to material which was not substituted.

FIG. 13 shows ferroelectric hysteresis loops for films deposited by MOCVD in accordance with the method of the invention, with a Zr/Ti ratio of 40/60 both with and without 1% Ca and 0.2% Ta substitution. Both films show full saturation below 2.5V and high remanent polarization. FIG. 14 shows the leakage current versus voltage for PZT with Zr/Ti of 40/60 and the same Zr/Ti with 1% Ca and 0.2% Ta substitution. The substituted material has 1/5th the leakage current density at 3V compared to material which was not substituted.

Thus, while the invention has been disclosed herein with respect to illustrative aspects, features and embodiments, it will be appreciated that the utility of the invention is not limited thereby, but rather extends to and encompasses a wide variety of variations, modifications and other embodiments which are to be accorded as being within the spirit and scope of the invention as hereinafter claimed.

What is claimed is:

1. A method of forming on a substrate a modified Pb(Zr,Ti)O$_3$ perovskite crystal material thin film including crystal lattice A-sites and B-sites at least one of which is modified by the presence of a substituent selected front the group consisting of (i) A-site substituents consisting of Sr, Ca, Ba and Mg, and (ii) B-site substituents selected from the group consisting of Nb and Ta, comprising liquid delivery MOCVD of the thin film from metalorganic precursors of the metal components of the thin film.

2. The method according to claim 1, wherein the metalorganic precursors comprise titanium bis(isopropoxide)bis (2,2,6,6-tetramethyl-3,5-heptanedionate), titanium bis(tertbutoxide)bis(2,2,6,6-tetramethyl-3,5-heptanedionate) or titanium oxo bis(2,2,6,6-tetramethyl-3,5-heptanedionate).

3. The method according to claim 1, wherein the metalorganic precursors comprise zirconium tetrakis(2,2,6,6-tetramethyl-3,5-heptanedionate) or zirconium bis(isopropoxide) bis(2,2,6,6-tetramethyl-3,5-heptanedionate).

4. The method according to claim 1, wherein the metalorganic precursors comprise lead bis(2,2,6,6-tetramethyl-3,5-heptanedionate) and Lewis base analogs of this material.

5. The method according to claim 1, wherein the Pb(Zr,Ti)O$_3$ perovskite crystal material comprises Sr or barium as an A-site substituent, and wherein the metalorganic precursors comprise strontium or barium bis(2,2,6,6-tetramethyl-3,5-heptanedionate) coordinated with Lewis bases such as tetraglyme, tetramethyl ethylenediamine and pentamethyl diethylenetriamine.

6. The method according to claim 1, wherein the Pb(Zr,Ti)O$_3$ perovskite crystal material comprises Ca or magnesium as an A-site substituent, and wherein the metalorganic precursors comprise calcium or magnesium bis(2,2,6,6-tetramethyl-3,5-heptanedionate) coordinated with Lewis bases such as tetraglyme, tetramethyl ethylenediamine and pentamethyl diethylenetriamine.

7. The method according to claim 1, wherein the metalorganic precursors comprise niobium tetrakis(isopropoxide)(2,2,6,6-tetramethyl-3,5-heptanedionate).

8. The method according to claim 1, wherein the metalorganic precursors comprise tantalum tetrakis(isopropoxide)(2,2,6,6-tetramethyl-3,5-heptanedionate).

9. The method according to claim 1, wherein the metalorganic precursors comprise at least one of titanium bis(isopropoxide)bis(2,2,6,6-tetramethyl-3,5-heptanedionate); zirconium tetrakis(2,2,6,6-tetramethyl-3,5-heptanedionate); lead bis(2,2,6,6-tetramethyl-3,5-heptanedionate); strontium bis(2,2,6,6-tetramethyl-3,5-heptanedionate).tetraglyme; and niobium tetrakis(isopropoxide)(2,2,6,6-tetramethyl-3,5-heptanedionate).

10. The method according to claim 1, wherein the metalorganic precursors comprise titanium bis(isopropoxide)bis(2,2,6,6-tetramethyl-3,5-heptanedionate); zirconium tetrakis(2,2,6,6-tetramethyl-3,5-heptanedionate); and lead bis(2,2,6,6-tetramethyl-3,5-heptanedionate).

11. The method according to claim 1, wherein the metalorganic precursors comprise titanium bis(isopropoxide)bis(2,2,6,6-tetramethyl-3,5-heptanedionate); zirconium tetrakis(2,2,6,6-tetramethyl-3,5-heptanedionate); lead bis(2,2,6,6-tetramethyl-3,5-heptanedionate); and at least one of strontium bis(2,2,6,6-tetramethyl-3,5-heptanedionate).tetraglyme and niobium tetrakis(isopropoxide)(2,2,6,6-tetramethyl-3,5-heptanedionate).

12. The method according to claim 1, wherein the metalorganic precursors comprise titanium bis(isopropoxide)bis(2,2,6,6-tetramethyl-3,5-heptanedionate); zirconium tetrakis(2,2,6,6-tetramethyl-3,5-heptanedionate); lead bis(2,2,6,6-tetramethyl-3,5-heptanedionate); and at least one of calcium bis(2,2,6,6-tetramethyl-3,5-heptanedionate) tetraglyme and tantalum tetrakis(isopropoxide)(2,2,6,6-tetramethyl-3,5-heptanedionate).

13. The method according to claim 1, wherein the modified Pb(Zr,Ti)O$_3$ perovskite crystal material thin film has a composition selected from the group consisting of:
(Pb,Sr)(Zr,Ti)O$_3$, (Pb,Ca)(Zr,Ti)O$_3$, (Pb,Ba)(Zr,Ti)O$_3$, (Pb,Mg)(Zr,Ti)O$_3$, (Pb)(Ta,Zr,Ti)O$_3$, (Pb,Ca)(Ta,Zr,Ti)O$_3$, (Pb,Sr)(Ta,Zr,Ti)O$_3$, (Pb,Ca)(Nb,Zr,Ti)O$_3$, and (Pb,Sr)(Nb,Zr,Ti)O$_3$.

14. The method according to claim 1, wherein the Pb(Zr,Ti)O$_3$ perovskite crystal material comprises PSZT.

15. The method according to claim 1, wherein the Pb(Zr,Ti)O$_3$ perovskite crystal material comprises a composition of the formula $$Pb_xSr_{(1-x)}Zr_yTi_{(1-y)}O_3,$$

wherein Pb:Sr:Zr:Ti has a ratio x:(1−x):y:(1−y), where x has a value of from about 0.86 to about 0.93, and y has a value of from about 0.50 to about 0.60.

* * * * *